United States Patent
Lin et al.

(10) Patent No.: US 10,121,768 B2
(45) Date of Patent: Nov. 6, 2018

(54) THERMALLY ENHANCED FACE-TO-FACE SEMICONDUCTOR ASSEMBLY WITH BUILT-IN HEAT SPREADER AND METHOD OF MAKING THE SAME

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 0 days.

(21) Appl. No.: 15/166,185

(22) Filed: May 26, 2016

(65) Prior Publication Data

US 2016/0351549 A1    Dec. 1, 2016

Related U.S. Application Data

(60) Provisional application No. 62/166,771, filed on May 27, 2015.

(51) Int. Cl.
*H01L 25/065* (2006.01)
*H01L 25/00* (2006.01)
(Continued)

(52) U.S. Cl.
CPC ...... *H01L 25/0657* (2013.01); *H01L 21/4817* (2013.01); *H01L 21/50* (2013.01); *H01L 21/561* (2013.01); *H01L 21/6835* (2013.01); *H01L 23/055* (2013.01); *H01L 23/13* (2013.01); *H01L 23/16* (2013.01); *H01L 23/36* (2013.01); *H01L 23/544* (2013.01); *H01L 24/19* (2013.01); *H01L 24/20* (2013.01); *H01L 24/97* (2013.01); *H01L 25/50* (2013.01); *H01L 21/568* (2013.01); *H01L 23/3128* (2013.01); *H01L 23/49816* (2013.01); *H01L 23/49822* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01);
(Continued)

(58) Field of Classification Search
None
See application file for complete search history.

(56) References Cited

U.S. PATENT DOCUMENTS 5,790,384 A    8/1998    Ahmad et al.
5,801,072 A    9/1998    Barber
(Continued)

*Primary Examiner* — Matthew Reames
*Assistant Examiner* — Steven B Gauthier
(74) *Attorney, Agent, or Firm* — Pai Patent & Trademark Law Firm; Chao-Chang David Pai

(57) ABSTRACT

A face-to-face semiconductor assembly is characterized in that first and second semiconductor devices are face-to-face mounted on two opposite sides of a first routing circuitry and is further electrically connected to an interconnect board through the first routing circuitry. The interconnect board has a heat spreader to provide thermal dissipation for the second semiconductor device, and a second routing circuitry formed on the heat spreader and electrically coupled to the first routing circuitry. The first routing circuitry provides primary fan-out routing for the first and second semiconductor devices, whereas the second routing circuitry provides further fan-out wiring structure for the first routing circuitry.

4 Claims, 19 Drawing Sheets

(51) Int. Cl.
  *H01L 23/13* (2006.01)
  *H01L 23/16* (2006.01)
  *H01L 21/56* (2006.01)
  *H01L 23/36* (2006.01)
  *H01L 23/544* (2006.01)
  *H01L 21/683* (2006.01)
  *H01L 21/48* (2006.01)
  *H01L 21/50* (2006.01)
  *H01L 23/055* (2006.01)
  *H01L 23/31* (2006.01)
  *H01L 23/00* (2006.01)
  *H01L 23/498* (2006.01)

(52) U.S. Cl.
  CPC ......... *H01L 2221/68359* (2013.01); *H01L 2221/68381* (2013.01); *H01L 2223/54426* (2013.01); *H01L 2223/54486* (2013.01); *H01L 2224/04105* (2013.01); *H01L 2224/12105* (2013.01); *H01L 2224/16227* (2013.01); *H01L 2224/16235* (2013.01); *H01L 2224/32225* (2013.01); *H01L 2224/32245* (2013.01); *H01L 2224/73253* (2013.01); *H01L 2224/73267* (2013.01); *H01L 2224/81005* (2013.01); *H01L 2224/81203* (2013.01); *H01L 2224/81207* (2013.01); *H01L 2224/81815* (2013.01); *H01L 2224/83005* (2013.01); *H01L 2224/8314* (2013.01); *H01L 2224/92225* (2013.01); *H01L 2224/92244* (2013.01); *H01L 2224/97* (2013.01); *H01L 2225/0651* (2013.01); *H01L 2225/06513* (2013.01); *H01L 2225/06558* (2013.01); *H01L 2225/06572* (2013.01); *H01L 2225/06582* (2013.01); *H01L 2225/06589* (2013.01); *H01L 2924/15153* (2013.01); *H01L 2924/15311* (2013.01); *H01L 2924/3025* (2013.01); *H01L 2924/3511* (2013.01); *H01L 2924/37001* (2013.01)

(56) References Cited

U.S. PATENT DOCUMENTS

| | | | |
|---|---|---|---|
| 5,977,640 A | 11/1999 | Bertin et al. | |
| 6,084,308 A | 7/2000 | Kelkar et al. | |
| 6,091,138 A | 7/2000 | Yu et al. | |
| 6,150,724 A | 11/2000 | Wenzel et al. | |
| 6,204,562 B1 | 3/2001 | Ho et al. | |
| 6,365,963 B1 | 4/2002 | Shimada | |
| 6,369,448 B1 | 4/2002 | McCormick | |
| 6,376,917 B1 | 4/2002 | Takeshita et al. | |
| 6,432,742 B1 | 8/2002 | Guan et al. | |
| 6,495,910 B1 | 12/2002 | Wu | |
| 6,507,115 B1 | 1/2003 | Hofstee et al. | |
| 6,555,917 B1 | 4/2003 | Heo | |
| 6,563,205 B1 | 5/2003 | Fogal et al. | |
| 6,586,836 B1 | 7/2003 | Ma et al. | |
| 6,659,512 B1 | 12/2003 | Harper et al. | |
| 6,709,898 B1* | 3/2004 | Ma | H01L 23/3128 257/675 |
| 6,768,208 B2 | 7/2004 | Lin et al. | |
| 6,844,619 B2 | 1/2005 | Tago | |
| 6,870,248 B1 | 3/2005 | Shibata | |
| 6,906,408 B2 | 6/2005 | Cloud et al. | |
| 6,984,544 B2 | 1/2006 | Cloud et al. | |
| 7,002,254 B2 | 2/2006 | Harper et al. | |
| 7,026,719 B2 | 4/2006 | Wang | |
| 7,087,988 B2 | 8/2006 | Hosomi | |
| 7,198,980 B2 | 4/2007 | Jiang et al. | |
| 7,205,646 B2 | 4/2007 | Lin et al. | |
| 7,218,005 B2 | 5/2007 | Tago | |
| 7,573,136 B2 | 8/2009 | Jiang et al. | |
| 7,592,689 B2 | 9/2009 | Brunnbauer | |
| 7,859,120 B2 | 12/2010 | Choi et al. | |
| 8,008,121 B2 | 8/2011 | Choi et al. | |
| 8,022,555 B2 | 9/2011 | Hwang et al. | |
| 8,035,216 B2 | 10/2011 | Skeete | |
| 8,143,097 B2 | 3/2012 | Chi et al. | |
| 8,148,806 B2 | 4/2012 | Lin et al. | |
| 8,227,904 B2 | 7/2012 | Braunisch et al. | |
| 8,288,854 B2 | 10/2012 | Weng et al. | |
| 8,421,222 B2 | 4/2013 | Lin et al. | |
| 8,519,537 B2 | 8/2013 | Jeng et al. | |
| 8,525,317 B1 | 9/2013 | Sutardja | |
| 8,558,395 B2 | 10/2013 | Khan et al. | |
| 8,648,469 B2 | 2/2014 | Choi et al. | |
| 8,836,115 B1 | 9/2014 | St Amand et al. | |
| 8,971,053 B2 | 3/2015 | Kariya et al. | |
| 9,048,306 B2 | 6/2015 | Chi et al. | |
| 9,252,032 B2 | 2/2016 | Choi et al. | |
| 9,252,130 B2 | 2/2016 | Kim et al. | |
| 9,263,332 B2 | 2/2016 | Chi et al. | |
| 9,281,300 B2 | 3/2016 | Merilo et al. | |
| 9,305,897 B2 | 4/2016 | Choi et al. | |
| 9,337,161 B2 | 5/2016 | Camacho et al. | |
| 9,379,078 B2 | 6/2016 | Yu et al. | |
| 9,385,095 B2 | 7/2016 | Jeng et al. | |
| 2004/0155325 A1 | 8/2004 | Ma et al. | |
| 2008/0182360 A1 | 7/2008 | Lin et al. | |
| 2012/0229990 A1* | 9/2012 | Adachi | H05K 3/4608 361/748 |
| 2014/0210107 A1 | 7/2014 | Zhai | |
| 2014/0217610 A1* | 8/2014 | Jeng | H01L 23/3128 257/774 |

* cited by examiner

THERMALLY ENHANCED FACE-TO-FACE SEMICONDUCTOR ASSEMBLY WITH BUILT-IN HEAT SPREADER AND METHOD OF MAKING THE SAME

CROSS REFERENCE TO RELATED APPLICATIONS

This application claims the benefit of filing date of U.S. Provisional Application Ser. No. 62/166,771 filed May 27, 2015. The entirety of said Provisional Application is incorporated herein by reference.

FIELD OF THE INVENTION

The present invention relates to a face-to-face semiconductor assembly and, more particularly, to a face-to-face semiconductor assembly having semiconductor devices face-to-face mounted on a first routing circuitry and further electrically connected to a second routing circuitry on a heat spreader through the first routing circuitry, and a method of making the same.

DESCRIPTION OF RELATED ART

Market trends of multimedia devices demand for faster and slimmer designs. One of assembly approaches is to interconnect two chips with "face-to-face" configuration so that the routing distance between the two chips can be the shortest possible. As the stacked chips can talk directly to each other with reduced latency, the assembly's signal integrity and additional power saving capability are greatly improved. As a result, the face-to-face semiconductor assembly offers almost all of the true 3D IC stacking advantages without the need of expensive through-silicon-via (TSV) in the stacked chips. U.S. Patent Application No. 2014/0210107 discloses stacked chip assembly with face-to-face configuration. Since the bottom chip is not protected and has to be thinner than the solder ball(s) for external connection, the assembly is not reliable and cannot be used in practical applications. U.S. Pat. Nos. 8,008,121, 8,519,537 and 8,558,395 disclose various assembly structures having an interposer disposed in between the face-to-face chips. Although there is no TSV in the stacked chips, the TSV in the interposer that serves for circuitry routing between chips induces complicated manufacturing processes, high yield loss and excessive cost. Additionally, as semiconductor devices are susceptible to performance degradation at high operation temperatures, stacking chips with face-to-face configuration without proper heat dissipation would worsen devices' thermal environment and may cause immediate failure during operation.

For the reasons stated above, and for other reasons stated below, an urgent need exists to provide a new face-to-face semiconductor assembly that can address high packaging density, better signal integrity and high thermal dissipation requirements.

SUMMARY OF THE INVENTION

A primary objective of the present invention is to provide a face-to-face semiconductor assembly in which top and bottom semiconductor devices are face-to-face mounted on a first fan-out routing circuitry so as to reduce the interconnect length between the top and bottom semiconductor devices, thereby ensuring superior electrical performance of the assembly.

Another objective of the present invention is to provide a face-to-face semiconductor assembly in which the first fan-out routing circuitry is electrically coupled with a second fan-out routing circuitry so that staged fan-out routing can be provided, thereby improving production yield and lowering the cost.

Yet another objective of the present invention is to provide a face-to-face semiconductor assembly in which the bottom semiconductor device is attached to a heat spreader so that the heat generated by the bottom semiconductor device can be effectively dissipated through the heat spreader, thereby improving thermal performance of the assembly.

In accordance with the foregoing and other objectives, the present invention provides a thermally enhanced face-to-face semiconductor assembly having a subassembly electrically coupled to a thermally enhanced component, wherein the subassembly includes a first semiconductor device, a balance layer and a first routing circuitry, and the thermally enhanced component includes a second semiconductor device, a heat spreader and a second routing circuitry disposed over the heat spreader. In a preferred embodiment, the first semiconductor device is electrically coupled to a top side of the first routing circuitry and laterally surrounded by the balance layer; the second semiconductor device is electrically coupled to a bottom side of the first routing circuitry by first bumps and thus is face-to-face electrically connected to the first semiconductor device through the first routing circuitry; the first routing circuitry provides primary fan-out routing and the shortest interconnection distance between the first semiconductor device and the second semiconductor device; the second routing circuitry is formed on the heat spreader and is electrically coupled to the bottom side of the first routing circuitry to provide further fan-out routing by second bumps laterally surrounding the second semiconductor device; and the heat spreader is thermally conductible to the second semiconductor device laterally surrounded by the second routing circuitry to provide thermal dissipation for the second semiconductor device.

In another aspect, the present invention provides a thermally enhanced face-to-face semiconductor assembly with a built-in heat spreader, comprising: a subassembly that includes a first semiconductor device, a balance layer and a first routing circuitry having a first surface and an opposite second surface, wherein the first semiconductor device is electrically coupled to the first routing circuitry from the first surface of the first routing circuitry and has an active surface facing the first routing circuitry and an inactive surface opposite to the active surface thereof, and the balance layer laterally surrounds the first semiconductor device and covers the first surface of the first routing circuitry; and a thermally enhanced component that is electrically coupled to the subassembly and includes a second semiconductor device, a heat spreader and a second routing circuitry disposed over the heat spreader, wherein (i) the second semiconductor device is attached to the heat spreader and laterally surrounded by the second routing circuitry and electrically coupled to the first routing circuitry by an array of first bumps, (ii) the second routing circuitry is electrically coupled to the first routing circuitry by an array of second bumps, and (iii) both the first bumps and the second bumps are disposed at the second surface of the first routing circuitry.

In yet another aspect, the present invention provides a method of making a thermally enhanced face-to-face semiconductor assembly with a built-in heat spreader, comprising steps of: providing a subassembly that includes (i)

providing a first routing circuitry detachably adhered over a sacrificial carrier, (ii) electrically coupling a first semiconductor device to the first routing circuitry from a first surface of the first routing circuitry, the first semiconductor device having an active surface facing the first routing circuitry and an inactive surface opposite to the active surface thereof, (iii) providing a balance layer that laterally surrounds the first semiconductor device and covers the first surface of the first routing circuitry, and (iv) removing the sacrificial carrier to expose a second surface of the first routing circuitry opposite to the first surface; electrically coupling a second semiconductor device to the first routing circuitry of the subassembly by an array of first bumps from the second surface of the first routing circuitry; providing an interconnect board that includes a heat spreader and a second routing circuitry disposed over the heat spreader; and electrically coupling the second routing circuitry of the interconnect board to the first routing circuitry of the subassembly by an array of second bumps from the second surface of the first routing circuitry, with the second semiconductor device attached to the heat spreader.

In yet another aspect, the present invention provides another method of making a thermally enhanced face-to-face semiconductor assembly with a built-in heat spreader, comprising steps of: providing a subassembly that includes (i) attaching a first semiconductor device to a stiffener, the first semiconductor device having an inactive surface facing the stiffener and an active surface opposite to the inactive surface, (ii) providing a balance layer that laterally surrounds the first semiconductor device, and (iii) forming a first routing circuitry over the balance layer and the active surface of the first semiconductor device, with the first semiconductor device electrically coupled to the first routing circuitry from a first surface of the first routing circuitry; electrically coupling a second semiconductor device to the first routing circuitry of the subassembly by an array of first bumps from a second surface of the first routing circuitry opposite to the first surface; providing an interconnect board that includes a heat spreader and a second routing circuitry disposed over the heat spreader; and electrically coupling the second routing circuitry of the interconnect board to the first routing circuitry of the subassembly by an array of second bumps from the second surface of the first routing circuitry, with the second semiconductor device attached to the heat spreader.

Unless specifically indicated or using the term "then" between steps, or steps necessarily occurring in a certain order, the sequence of the above-mentioned steps is not limited to that set forth above and may be changed or reordered according to desired design.

The face-to-face semiconductor assembly and the method of making the same according to the present invention have numerous advantages. For instance, face-to-face electrically coupling the first and second semiconductor devices to both opposite sides of the first routing circuitry can offer the shortest interconnect distance between the first and second semiconductor devices. Electrically coupling the subassembly to the second routing circuitry on the heat spreader is particularly advantageous as the heat spreader can provide thermal dissipation for the second semiconductor device and serve as a support platform for the subassembly and the second routing circuitry. Additionally, the two-stage formation of the wiring substrate for the first and second semiconductor devices is beneficial as the first routing circuitry can provide primary fan-out routing whereas the second routing circuitry provides further fan-out routing, and serious warping problem can be avoided when multiple layers of routing circuitries are need.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENTS

Figure 1:
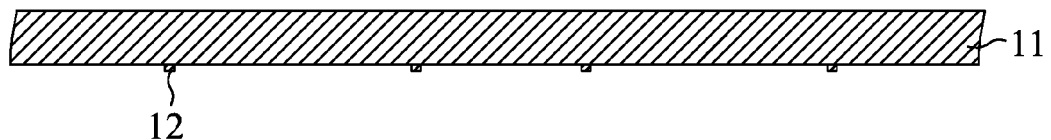
FIGS. 1 and 2 are cross-sectional and bottom perspective views, respectively, of alignment guides formed on a stiffener in accordance with the first embodiment of the present invention.

Hereafter, examples will be provided to illustrate the embodiments of the present invention. Advantages and effects of the invention will become more apparent from the following description of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-30 are schematic views showing a method of making a face-to-face semiconductor assembly that includes a stiffener 11, an alignment guide 12, a first semiconductor device 13, a balance layer 15, a first routing circuitry 16, a second semiconductor device 17, a heat spreader 21 and a second routing circuitry 24 in accordance with the first embodiment of the present invention.

Figure 2:
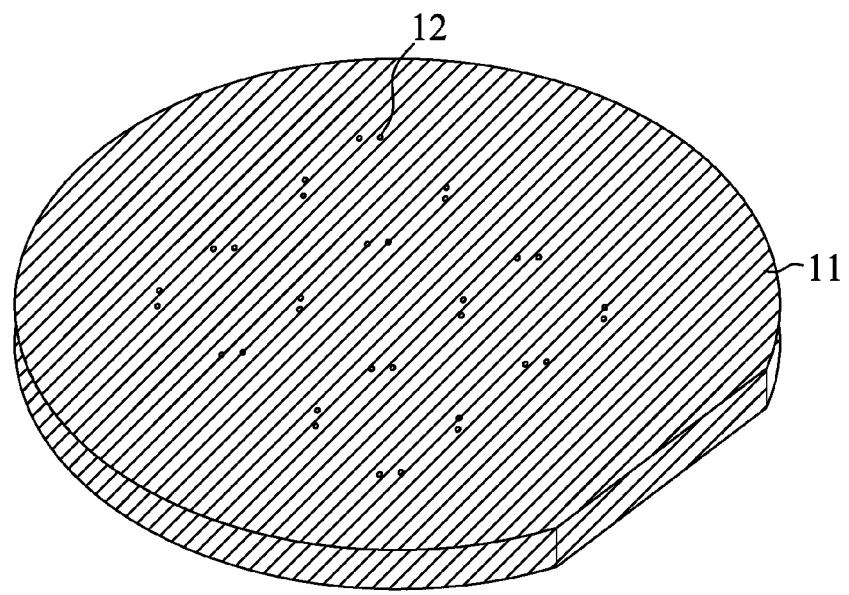

FIGS. 1 and 2 are cross-sectional and bottom perspective views, respectively, of the structure with multiple sets of alignment guides 12 on a stiffener 11. The stiffener 11 typically is made of a thermally conductive material, such as metal, alloy, silicon, ceramic or graphite, but any other thermally non-conductive material, such as mold compound, also may be used. The thickness of the stiffener 11 preferably ranges from 0.1 to 1.0 mm. The alignment guides 12 project from the bottom surface of the stiffener 11 and can have a thickness of 5 to 200 microns. In this embodiment, the stiffener 11 has a thickness of 0.5 mm, whereas the alignment guides 12 have a thickness of 50 microns. The alignment guides 12 can be pattern deposited by numerous techniques, such as electroplating, electroless plating, evaporating, sputtering or their combinations using photo-lithographic process, or be thin-film deposited followed by a metal patterning process. The metal patterning techniques include wet etching, electro-chemical etching, laser-assist etching, and their combinations with an etch mask (not shown) thereon that defines the alignment guides 12. For an electrically conductive stiffener 11, the alignment guides 12 are deposited typically by plating of metal (such as copper). Alternatively, if an electrically non-conductive stiffener 11 is used, a solder mask or photo resist may be used to form the alignment guides 12. As shown in FIG. 2, each set of the alignment guides 12 consists of plural posts and conform to four corners of a subsequently disposed semiconductor device. However, the alignment guide patterns are not limited thereto and can be in other various patterns against undesirable movement of the subsequently disposed semiconductor device. For instance, the alignment guides 12 may consist of a continuous or discontinuous strip and conform to four sides, two diagonal corners or four corners of a subsequently disposed semiconductor device. Alternatively, the alignment guides 12 may laterally extend to the peripheral edges of the stiffener 11 and have inner peripheral edges that conform to the peripheral edges of a subsequently disposed semiconductor device.

Figure 3:
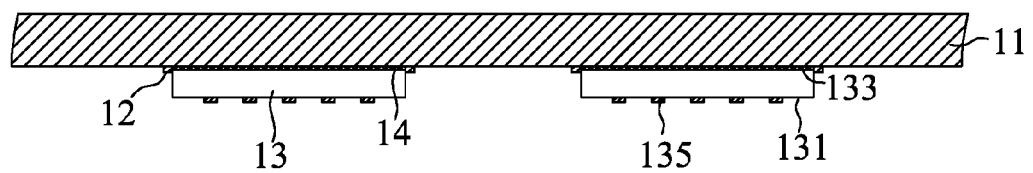
FIGS. 3 and 4 are cross-sectional and bottom perspective views, respectively, showing that first semiconductor devices are attached to the stiffener of FIGS. 1 and 2 in accordance with the first embodiment of the present invention.
Figure 4:
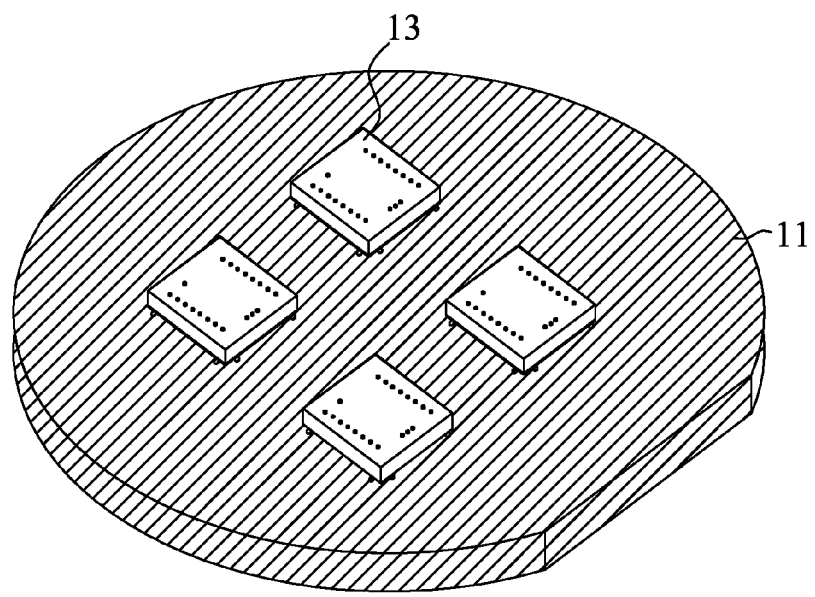

FIGS. 3 and 4 are cross-sectional and bottom perspective views, respectively, of the structure with first semiconductor devices 13 attached to the stiffener 11 using an adhesive 14. For a thermally conductive stiffener 11, the adhesive 14 typically is a thermally conductive adhesive. The first semiconductor devices 13, illustrated as bare chips, each includes protruded bumps 135 at its active surface 131, and is attached to the stiffener 11 with its inactive surface 133 facing the stiffener 11. Each set of the alignment guides 12 is laterally aligned with and in close proximity to the peripheral edges of each first semiconductor device 13. The device placement accuracy is provided by the alignment guides 12 that extend beyond the inactive surface 133 of the first semiconductor devices 13 in the downward direction and are located beyond and laterally aligned with the four corners of the first semiconductor devices 13 in the lateral directions. Because the alignment guides 12 are in close proximity to and conform to the four corners of the first semiconductor devices 13 in lateral directions, any undesirable movement of the first semiconductor devices 13 due to adhesive curing can be avoided. Preferably, a gap in between the alignment guides 12 and the first semiconductor devices 13 is in a range of about 5 to 50 microns. Additionally, the first semiconductor devices 13 also may be attached without the alignment guides 12.

Figure 5:
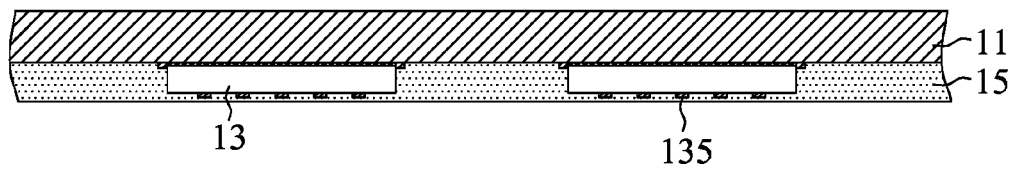
FIG. 5 is a cross-sectional view showing that the structure of FIG. 3 is provided with a balance layer in accordance with the first embodiment of the present invention.

FIG. 5 is a cross-sectional view of the structure provided with a balance layer 15 on the first semiconductor devices 13, the alignment guides 12 and the stiffener 11 by, for example, resin-glass lamination, resin-glass coating or molding. The balance layer 15 covers the first semiconductor devices 13, the alignment guides 12 and the stiffener 11 from below and surrounds and conformally coats and covers sidewalls of the first semiconductor devices 13 and extends laterally from the first semiconductor devices 13 to the peripheral edges of the structure.

Figure 6:
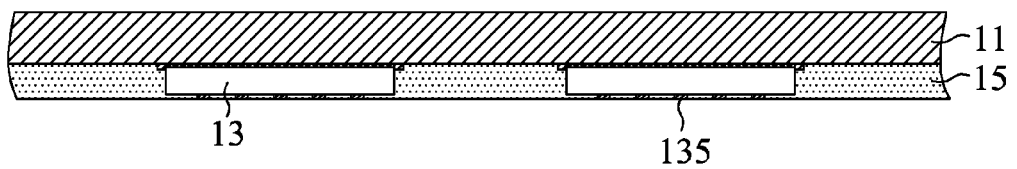
FIG. 6 is a cross-sectional view showing that a bottom portion of the balance layer is removed from the structure of FIG. 5 in accordance with the first embodiment of the present invention.

FIG. 6 is a cross-sectional view of the structure with the protruded bumps 135 of the first semiconductor devices 13 exposed from below. The lower portion of the balance layer 15 can be removed by lapping, grinding or laser. After partial removal of the balance layer 15, the balance layer 15 has a bottom surface substantially coplanar with the external surface of the protruded bumps 135.

Figure 7:
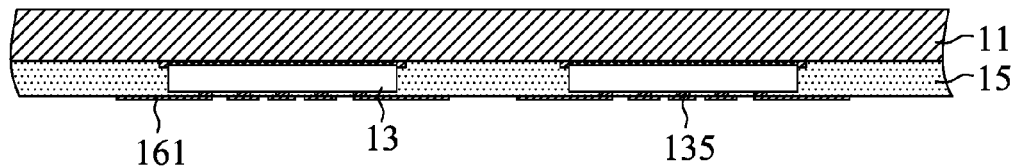
FIGS. 7 and 8 are cross-sectional and bottom perspective views, respectively, showing that the structure of FIG. 6 is provided with primary conductive traces in accordance with the first embodiment of the present invention.
Figure 8:
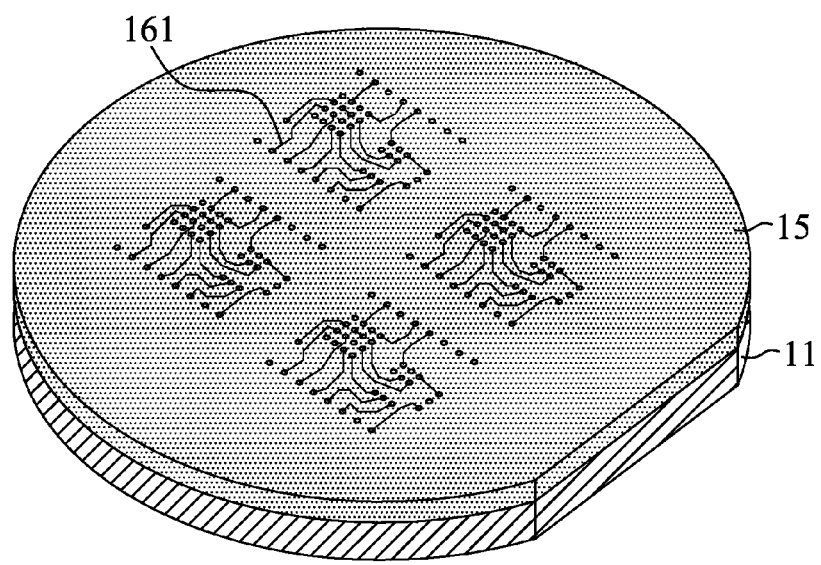

FIGS. 7 and 8 are cross-sectional and bottom perspective views, respectively, of the structure provided with primary conductive traces 161 by metal deposition and metal patterning process. The primary conductive traces 161 typically are made of copper and extend laterally on the balance layer 15 and are electrically coupled to the protruded bumps 135 of the first semiconductor devices 13.

The primary conductive traces 161 can be deposited as a single layer or multiple layers by any of numerous techniques, such as electroplating, electroless plating, evaporating, sputtering or their combinations. For instance, they can be deposited by first dipping the structure in an activator solution to render the balance layer 15 catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, the plated layer can be patterned to form the primary conductive traces 161 by any of numerous techniques, such as wet etching, electro-chemical etching, laser-assist etching, or their combinations, with an etch mask (not shown) thereon that defines the primary conductive traces 161. As a result, the primary conductive traces 161 can provide horizontal signal routing in both the X and Y directions and serve as electrical connections for the first semiconductor devices 13.

Figure 9:
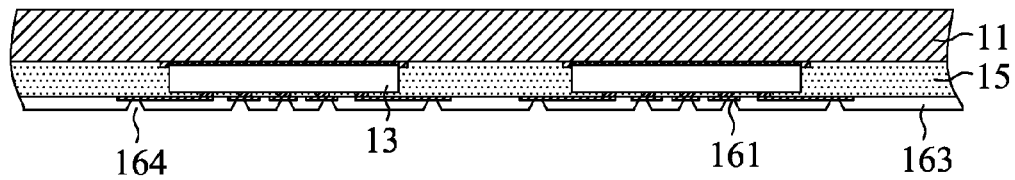
FIG. 9 is a cross-sectional view showing that the structure of FIG. 8 is provided with a first dielectric layer and first via openings in accordance with the first embodiment of the present invention.

FIG. 9 is a cross-sectional view of the structure with a first dielectric layer 163 on the balance layer 15 as well as the primary conductive traces 161 and first via openings 164 in the first dielectric layer 163. The first dielectric layer 163 is deposited typically by lamination or coating, and contacts and covers and extends laterally on the balance layer 15 and the primary conductive traces 161 from below. The first dielectric layer 163 typically has a thickness of 50 microns, and can be made of epoxy resin, glass-epoxy, polyimide, or the like. After the deposition of the first dielectric layer 163, the first via openings 164 are formed by numerous techniques, such as laser drilling, plasma etching and photolithography, and typically have a diameter of 50 microns. Laser drilling can be enhanced by a pulsed laser. Alternatively, a scanning laser beam with a metal mask can be used. The first via openings 164 extend through the first dielectric layer 163 and are aligned with selected portions of the primary conductive traces 161.

Figure 10:
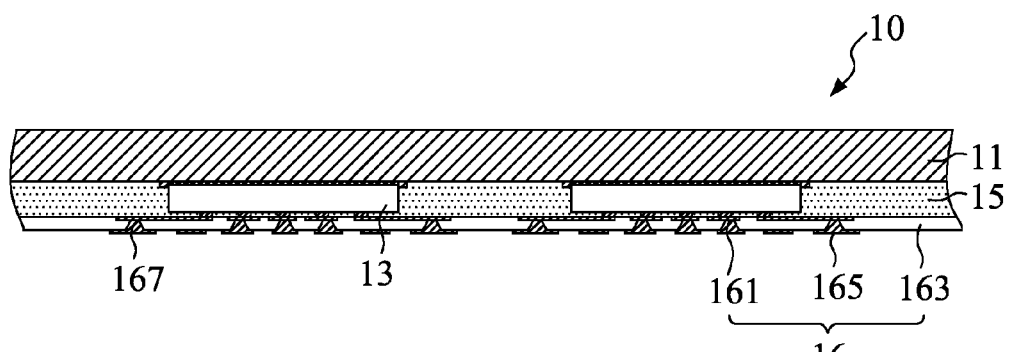
FIGS. 10 and 11 are cross-sectional and bottom perspective views, respectively, showing that the structure of FIG. 9 is provided with first conductive traces in accordance with the first embodiment of the present invention.
Figure 11:
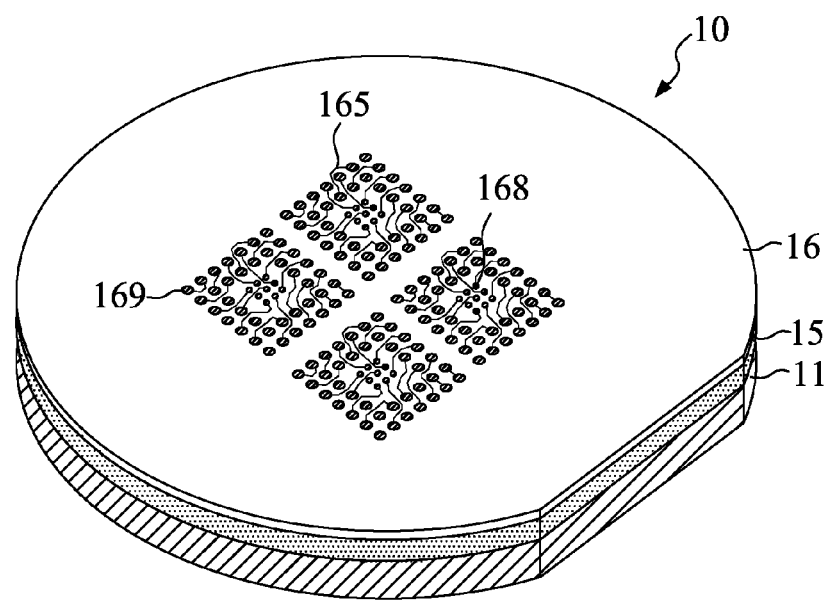

FIGS. 10 and 11 are cross-sectional and bottom perspective views, respectively, of the structure provided with first conductive traces 165 on the first dielectric layer 163 by metal deposition and metal patterning process. The first conductive traces 165 extend from the primary conductive traces 161 in the downward direction, fill up the first via openings 164 to form first conductive vias 167 in direct contact with the primary conductive traces 161, and extend laterally on the first dielectric layer 163. As shown in FIG. 11, the first conductive traces 165 include first contact pads 168 and second contact pads 169. The second contact pads 169 have larger pad size and pitch than those of the first contact pads 168. As a result, the first contact pads 168 can provide electrical contacts for another semiconductor device, whereas the second contact pads 169 can provide electrical contacts for a next level interconnect structure.

At this stage, a subassembly 10 is accomplished and includes a stiffener 11, first semiconductor devices 13, a balance layer 15 and a first routing circuitry 16. In this illustration, the first routing circuitry 16 includes primary conductive traces 161, a first dielectric layer 163 and first conductive traces 165.

Figure 12:
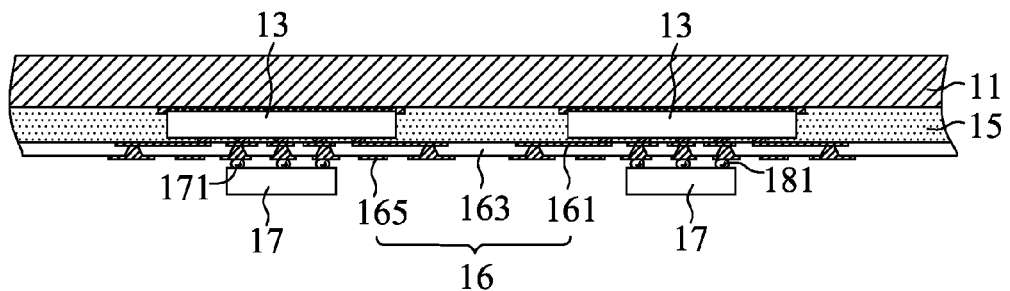
FIGS. 12 and 13 are cross-sectional and bottom perspective views, respectively, showing that second semiconductor devices are electrically coupled to the structure of FIGS. 10 and 11 by first bumps in accordance with the first embodiment of the present invention.
Figure 13:
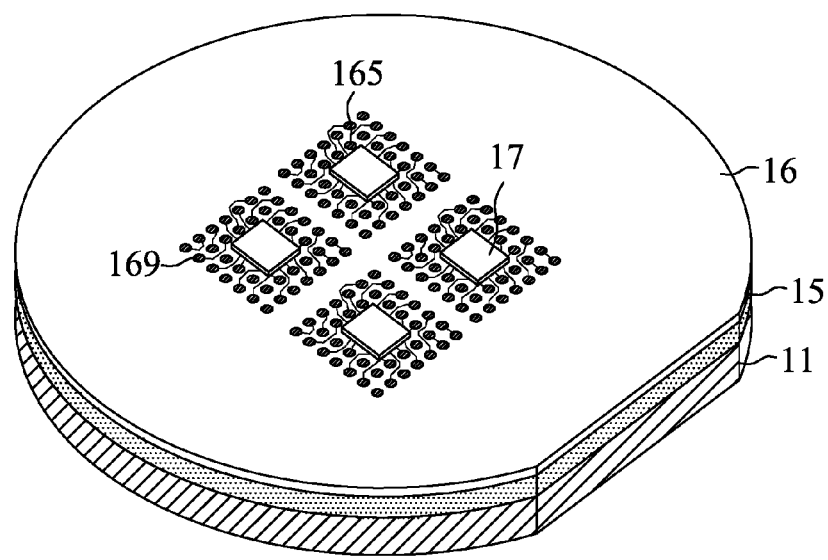

FIGS. 12 and 13 are cross-sectional and bottom perspective views, respectively, of the structure provided with second semiconductor devices 17 electrically coupled to the first routing circuitry 16. The second semiconductor devices 17, illustrated as bare chips, have an active surface 171 facing the first routing circuitry 16, and can be electrically coupled to the first contact pads 168 of the first conductive traces 165 using first bumps 181 by thermal compression, solder reflow or thermosonic bonding.

Figure 14:
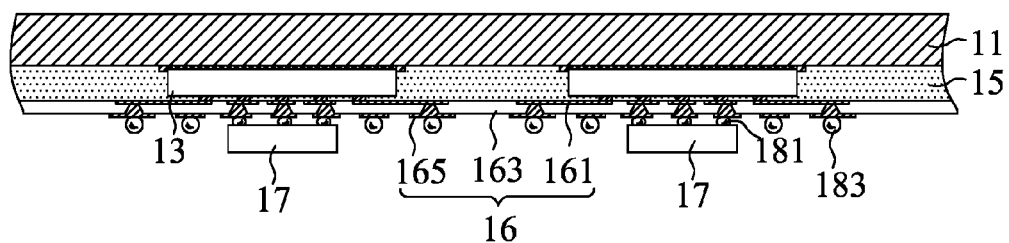
FIG. 14 is a cross-sectional view showing that the structure of FIG. 12 is provided with second bumps in accordance with the first embodiment of the present invention.

FIG. 14 is a cross-sectional view of the structure provided with second bumps 183 on the first routing circuitry 16. The second bumps 183 are mounted on the second contact pads 169 of the first conductive traces 165 and have a height larger than that of the first bumps 181 but smaller than the combined height of the first bumps 181 and the second semiconductor device 17.

Figure 15:
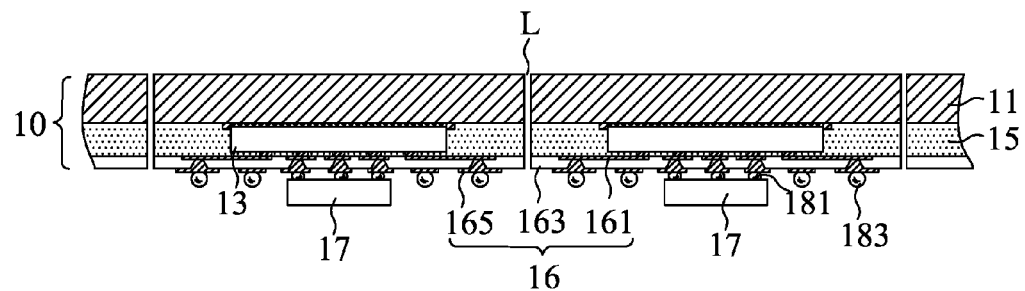
FIGS. 15 and 16 are cross-sectional and bottom perspective views, respectively, of a diced state of the panel-scale structure of FIG. 14 in accordance with the first embodiment of the present invention.
Figure 16:
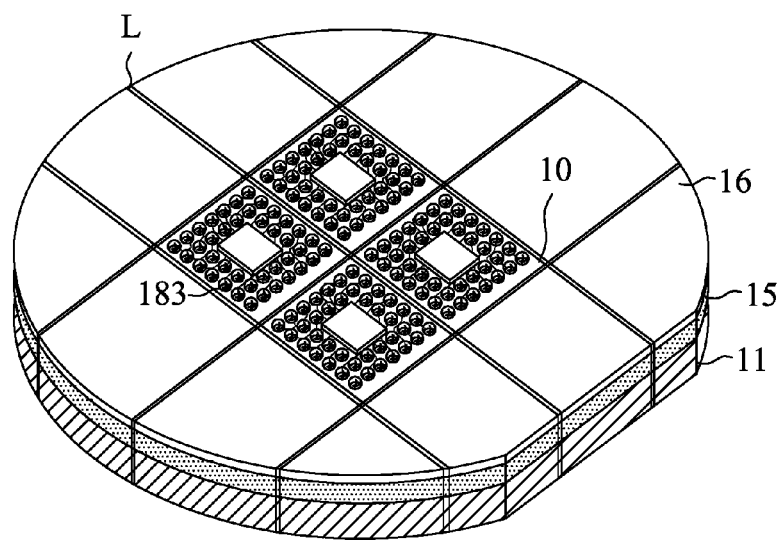

FIGS. 15 and 16 are cross-sectional and bottom perspective views, respectively, of the panel-scale structure of FIG. 14 diced into individual pieces. The panel-scale structure is singulated into individual pieces, each having a second semiconductor device 17 electrically coupled to a diced unit of subassembly 10, along dicing lines "L".

Figure 17:
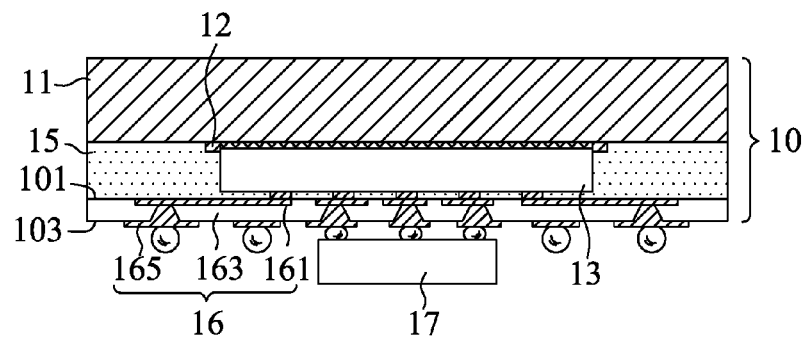
FIG. 17 is a cross-sectional view of the structure corresponding to a diced unit in FIG. 15 in accordance with the first embodiment of the present invention.

FIG. 17 is a cross-sectional view of an individual piece having a second semiconductor device 17 and a subassembly 10 that includes a stiffener 11, an alignment guide 12, a first semiconductor device 13, a balance layer 15 and a first routing circuitry 16. In this illustration, the first routing circuitry 16 is a multi-layered buildup circuitry that includes primary conductive traces 161 and first conductive traces 165 laterally extending beyond peripheral edges of the first semiconductor device 13 and the second semiconductor device 17. The first semiconductor device 13 is electrically coupled to the first routing circuitry 16 from the first surface 101 and enclosed by the stiffener 11 and the balance layer 15, whereas the second semiconductor device 17 is electrically coupled to the first routing circuitry 16 from the second surface 103 and is face-to-face electrically connected to the first semiconductor device 13 through the first routing circuitry 16.

FIGS. 18-21 are cross-sectional views showing an alternative process of forming the structure having the second semiconductor device 17 electrically coupled to the subassembly 10.

Figure 18:
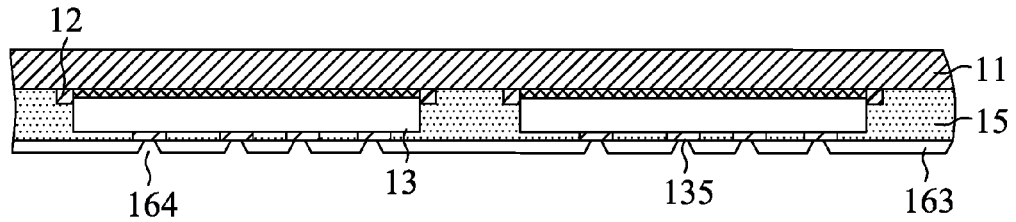
FIG. 18 is a cross-sectional view showing that the structure of FIG. 6 is provided with a first dielectric layer and first via openings in accordance with the first embodiment of the present invention.

FIG. 18 is a cross-sectional view of the structure with a first dielectric layer 163 laminated/coated on the first semiconductor devices 13 and the balance layer 15 and first via openings 164 in the first dielectric layer 163. The first dielectric layer 163 contacts and covers and extends laterally on the protruded bumps 135 of the first semiconductor devices 13 and the balance layer 15 from below. The first via openings 164 extend through the first dielectric layer 163 and are aligned with the protruded bumps 135 of the first semiconductor devices 13.

Figure 19:
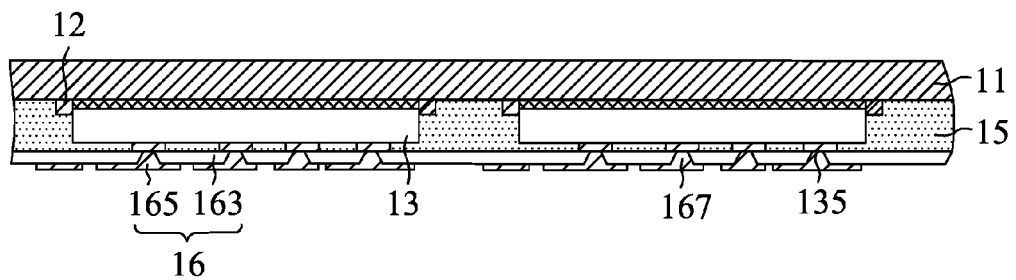
FIG. 19 is a cross-sectional view showing that the structure of FIG. 18 is provided with first conductive traces in accordance with the first embodiment of the present invention.

FIG. 19 is a cross-sectional view of the structure provided with first conductive traces 165 on the first dielectric layer 163 by metal deposition and metal patterning process. The first conductive traces 165 extend from the protruded bumps 135 of the first semiconductor devices 13 in the downward direction, fill up the first via openings 164 to form first conductive vias 167 in direct contact with the protruded bumps 135, and extend laterally on the first dielectric layer 163.

Figure 20:
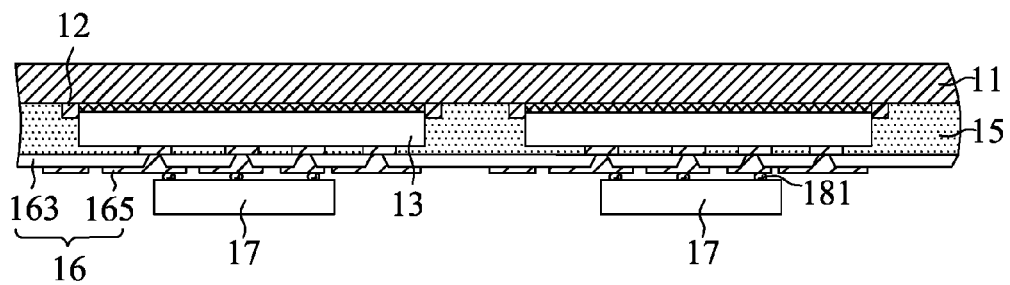
FIG. 20 is a cross-sectional view showing that second semiconductor devices are electrically coupled to the structure of FIG. 19 in accordance with the first embodiment of the present invention.

FIG. 20 is a cross-sectional view of structure provided with second semiconductor devices 17 electrically coupled to the first routing circuitry 16. The second semiconductor devices 17 are electrically coupled to the first conductive traces 165 using first bumps 181.

Figure 21:
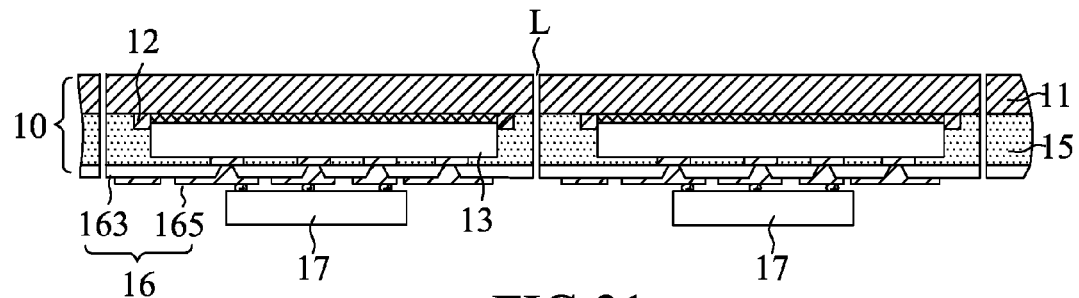
FIG. 21 is a cross-sectional view of a diced state of the panel-scale structure of FIG. 20 in accordance with the first embodiment of the present invention.

FIG. 21 is a cross-sectional view of the panel-scale structure of FIG. 20 diced into individual pieces. The panel-scale structure is singulated into individual pieces, each having a second semiconductor device 17 and a diced unit of subassembly 10, along dicing lines "L".

Figure 22:
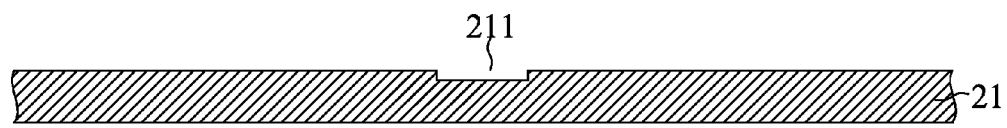
FIGS. 22 and 23 are cross-sectional and top perspective views, respectively, of a heat spreader in accordance with the first embodiment of the present invention.
Figure 23:
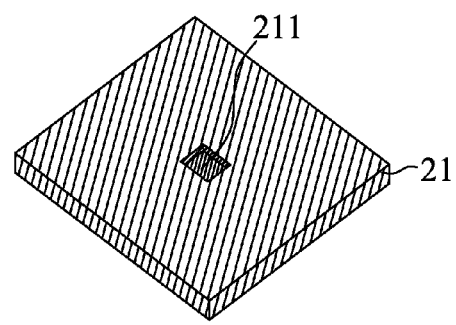

FIGS. 22 and 23 are cross-sectional and top perspective views, respectively, of a heat spreader 21. The heat spreader 21 can be made of any material with high thermal conductivity, such as copper, aluminum, stainless steel, silicon, ceramic, graphite or other metals or alloys, and is formed with a recess 211. The thickness of the heat spreader 21 can range from 0.5 to 2.0 mm. In this embodiment, the heat spreader 21 has a thickness of 1.0 mm.

Figure 24:
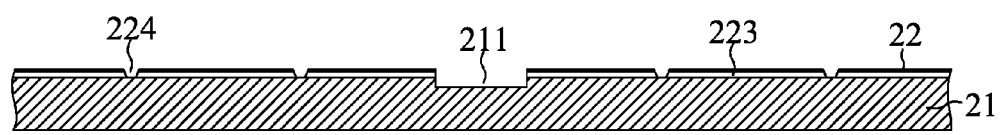
FIG. 24 is a cross-sectional view showing that the structure of FIG. 22 is provided with a second dielectric layer, a metal layer and second via openings in accordance with the first embodiment of the present invention.

FIG. 24 is a cross-sectional view of the structure with a second dielectric layer 223 and a metal layer 22 laminated/coated on a selected portion of the heat spreader 21 outside of the recess 211 from above and second via openings 224 in the second dielectric layer 223 as well as the metal layer 22. The second dielectric layer 223 contacts and is sandwiched between the heat spreader 21 and the metal layer 22. The second dielectric layer 223 can be formed of epoxy resin, glass-epoxy, polyimide, or the like, and typically has a thickness of 50 microns. The metal layer 22 typically is a copper layer with a thickness of 25 microns. The second via openings 224 extend through the metal layer 22 and the second dielectric layer 223 to expose selected portions of the heat spreader 21 from above. Like the first via openings 164, the second via openings 224 can be formed by any of numerous techniques, such as laser drilling, plasma etching and photolithography and typically have a diameter of 50 microns.

Figure 25:
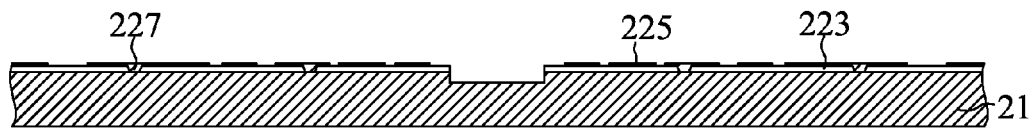
FIG. 25 is a cross-sectional view showing that the structure of FIG. 24 is provided with second conductive traces in accordance with the first embodiment of the present invention.

Referring now to FIG. 25, second conductive traces 225 are formed on the second dielectric layer 223 by metal deposition and metal patterning process. The second conductive traces 225 extend from the heat spreader 21 in the upward direction, fill up the second via openings 224 to form second conductive vias 227 in direct contact with the heat spreader 21, and extend laterally on the second dielectric layer 223.

Figure 26:
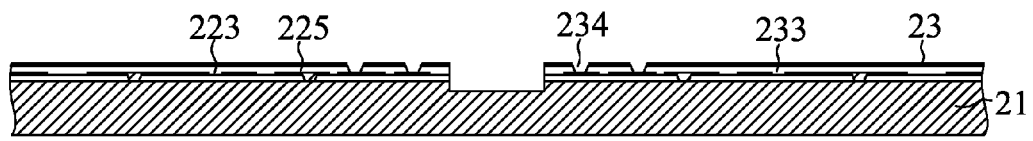
FIG. 26 is a cross-sectional view showing that the structure of FIG. 25 is provided with a third dielectric layer, a metal layer and third via openings in accordance with the first embodiment of the present invention.

FIG. 26 is a cross-sectional view of the structure with a third dielectric layer 233 and a metal layer 23 laminated/coated on the second dielectric layer 223/second conductive traces 225 from above and third via openings 234 in the third dielectric layer 233 as well as the metal layer 23. The third dielectric layer 233 contacts and is sandwiched between the second dielectric layer 223 and the metal layer 23 and between the second conductive traces 225 and the metal layer 23. The third dielectric layer 233 can be formed of epoxy resin, glass-epoxy, polyimide, or the like, and typically has a thickness of 50 microns. The metal layer 23 typically is a copper layer with a thickness of 25 microns. The third via openings 234 extend through the metal layer 23 and the third dielectric layer 233 to expose selected portions of the second conductive traces 225 from above. Like the first via openings 164 and the second via openings 224, the third via openings 234 can be formed by any of numerous techniques, such as laser drilling, plasma etching and photolithography and typically have a diameter of 50 microns.

Figure 27:
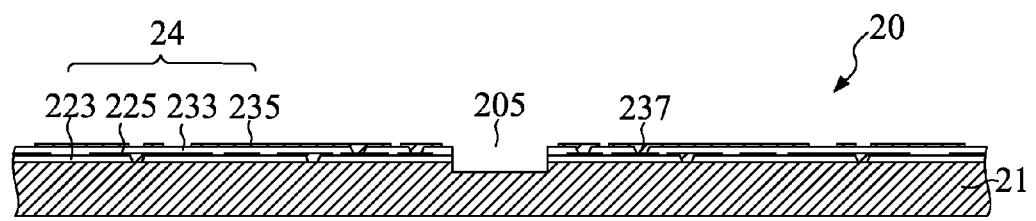
FIGS. 27 and 28 are cross-sectional and top perspective views, respectively, showing that the structure of FIG. 26 is provided with third conductive traces to finish the fabrication of an interconnect board in accordance with the first embodiment of the present invention.
Figure 28:
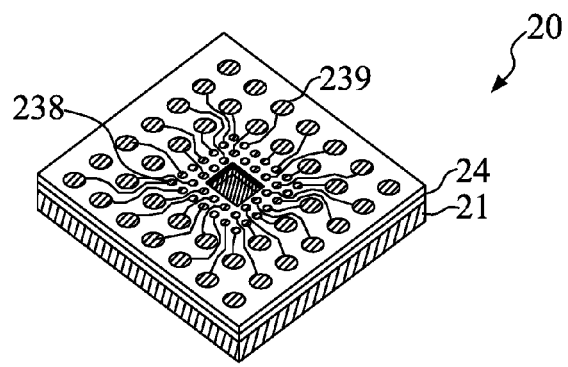

FIGS. 27 and 28 are cross-sectional and top perspective views, respectively, of the structure provided with third conductive traces 235 on the third dielectric layer 233 by metal deposition and metal patterning process. The third conductive traces 235 extend from the second conductive traces 225 in the upward direction, fill up the third via openings 234 to form third conductive vias 237 in direct contact with the second conductive traces 225, and extend laterally on the third dielectric layer 233. As shown in FIG. 28, the third conductive traces 235 includes first terminal pads 238 and second terminal pads 239. The pad size and pad pitch of the first terminal pads 238 are larger than those of the first semiconductor device 13 and the second semiconductor device 17 and match the second contact pads 169 of the first routing circuitry 16. The pad size and pad pitch of the second terminal pads 239 are larger than those of the first terminal pads 238 and match a next level interconnect structure (such as printed circuit board).

At this stage, an interconnect board 20 having a cavity 205 is accomplished and includes a heat spreader 21 and a second routing circuitry 24. In this illustration, the second routing circuitry 24 is a multi-layered buildup circuitry that includes a second dielectric layer 223, second conductive traces 225, a third dielectric layer 233 and third conductive traces 235 and is electrically coupled to the heat spreader 21 for ground connection. The cavity 205 extends through the second routing circuitry 24 to expose a selected portion of the heat spreader 21 from above.

Figure 29:
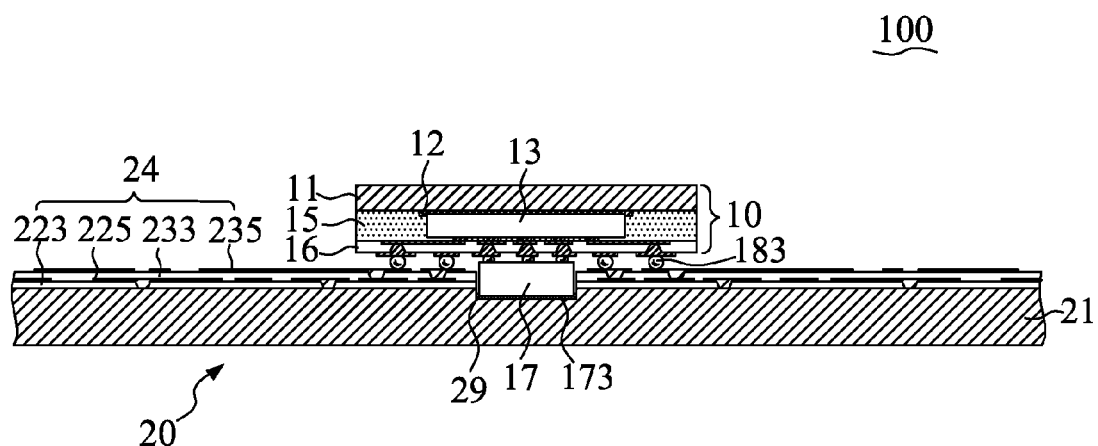
FIGS. 29 and 30 are cross-sectional and top perspective views, respectively, showing that the structure of FIG. 17 is mounted on the interconnect board of FIGS. 27 and 28 to finish the fabrication of a face-to-face semiconductor assembly in accordance with the first embodiment of the present invention.
Figure 30:
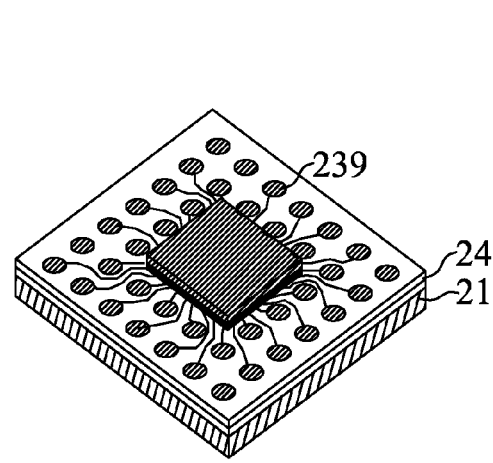

FIGS. 29 and 30 are cross-sectional and top perspective views, respectively, of the structure with the structure of FIG. 17 mounted on the interconnect board 20 of FIG. 27. The second semiconductor device 17 is inserted into the cavity 205 of the interconnect board 20, with its inactive surface 173 attached to the heat spreader 21 of the interconnect board 20 using a thermally conductive material 29 (typically thermally conductive adhesive). The second routing circuitry 24 of the interconnect board 20 is electrically coupled to the first routing circuitry 16 of the subassembly 10 through the second bumps 183 in contact with the second contact pads 169 and the first terminal pads 238. As a result, the combined height of the first bumps 181 and the second semiconductor device 17 is approximated by the sum of the depth of the cavity 205 plus the height of the second bumps 183.

Accordingly, as shown in FIGS. 29 and 30, a face-to-face semiconductor assembly 100 is accomplished and includes a subassembly 10 electrically coupled to a thermally enhanced component having a second semiconductor device 17 thermally conductible to an interconnect board 20. In this illustration, the subassembly 10 includes a stiffener 11, an alignment guide 12, a first semiconductor device 13, a balance layer 15 and a first routing circuitry 16, whereas the interconnect board 20 includes a heat spreader 21 and a second routing circuitry 24.

The first semiconductor device 13 is attached to the stiffener 11 with the alignment guide 12 around its inactive surface 133 and conforming to its four corners. The first routing circuitry 16 is electrically coupled to the first semiconductor device 13 and laterally extends beyond peripheral edge of the first semiconductor device 13 and over the balance layer 15 that laterally surrounds the first semiconductor device 13. The second semiconductor device 17 is face-to-face electrically connected to the first semiconductor device 13 through the first routing circuitry 16 and first bumps 181 in contact with the first routing circuitry 16. As such, the first routing circuitry 16 offers the shortest interconnection distance between the first semiconductor device 13 and the second semiconductor device 17, and provides first level fan-out routing for the first semiconductor device 13 and the second semiconductor device 17. The second routing circuitry 24 includes second conductive traces 225 and third conductive traces 235 laterally extending beyond peripheral edges of the first routing circuitry 16, and is electrically coupled to the first routing circuitry 16 using second bumps 183 to provide second level fan-out routing for the first routing circuitry 16. As a result, the second routing circuitry 24 is electrically connected to the second semiconductor device 17 through the first bumps 181, the first routing circuitry 16 and the second bumps 183. The heat spreader 21 not only serves as a platform for deposition of the second routing circuitry 24 thereon, but also provides thermal dissipation for the second semiconductor device 17.

Embodiment 2

FIGS. 31-44 are schematic views showing a method of making another face-to-face semiconductor assembly that includes another aspect of subassembly in accordance with the second embodiment of the present invention.

For purposes of brevity, any description in Embodiment 1 above is incorporated herein insofar as the same is applicable, and the same description need not be repeated.

Figure 31:
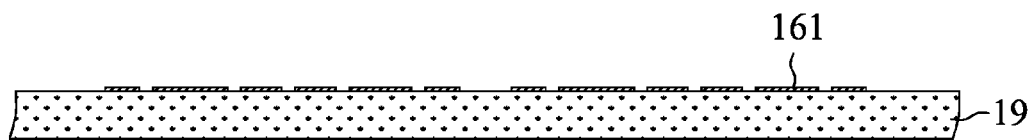
FIG. 31 is a cross-sectional view showing that primary conductive traces are deposited on a sacrificial carrier in accordance with the second embodiment of the present invention.

FIG. 31 is a cross-sectional view of the structure with primary conductive traces 161 formed on a sacrificial carrier 19 by metal deposition and metal patterning process. In this illustration, the sacrificial carrier 19 is a single-layer structure. The sacrificial carrier 19 typically is made of copper, aluminum, iron, nickel, tin, stainless steel, silicon, or other metals or alloys, but any other electrically conductive or non-conductive material also may be used. In this embodiment, the sacrificial carrier 19 is made of an iron-based material.

Figure 32:
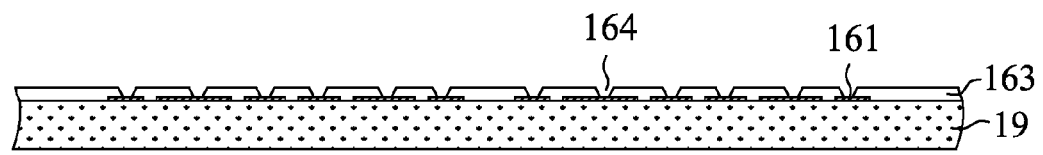
FIG. 32 is a cross-sectional view showing that the structure of FIG. 31 is provided with a first dielectric layer and first via openings in accordance with the second embodiment of the present invention.

FIG. 32 is a cross-sectional view of the structure with a first dielectric layer 163 laminated/coated on the sacrificial carrier 19 as well as the primary conductive traces 161 and first via openings 164 in the first dielectric layer 163. The first dielectric layer 163 contacts and covers and extends laterally on the sacrificial carrier 19 and the primary conductive traces 161 from above. The first via openings 164 extend through the first dielectric layer 163 and are aligned with selected portions of the primary conductive traces 161.

Figure 33:
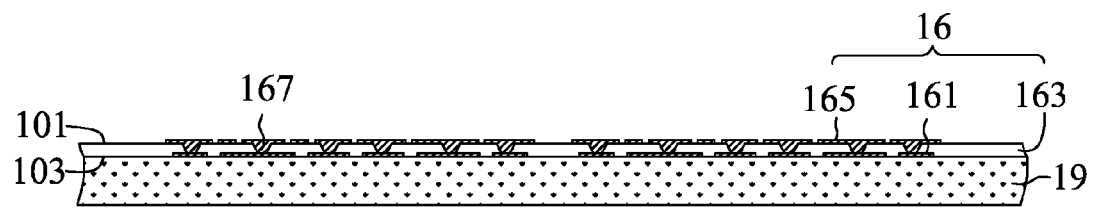
FIG. 33 is a cross-sectional view showing that the structure of FIG. 32 is provided with first conductive traces in accordance with the second embodiment of the present invention.

FIG. 33 is a cross-sectional view of the structure provided with first conductive traces 165 on the first dielectric layer 163 by metal deposition and metal patterning process. The first conductive traces 165 extend from the primary conductive traces 161 in the upward direction, fill up the first via openings 164 to form first conductive vias 167 in direct contact with the primary conductive traces 161, and extend laterally on the first dielectric layer 163.

At this stage, the formation of a first routing circuitry 16 on the sacrificial carrier 19 is accomplished. In this illustration, the first routing circuitry 16 includes primary conductive traces 161, a first dielectric layer 163 and first conductive traces 165, and provides electrical contacts at its opposite first surface 101 and second surface 103.

Figure 34:
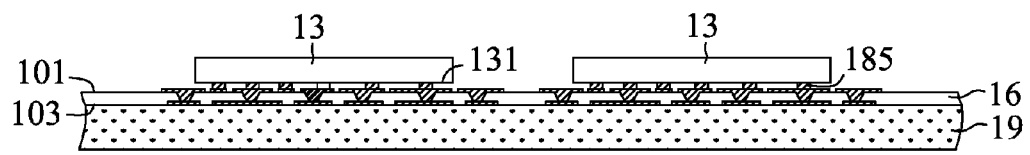
FIG. 34 is a cross-sectional view showing that first semiconductor devices are electrically coupled to the structure of FIG. 33 in accordance with the second embodiment of the present invention.

FIG. 34 is a cross-sectional view of the structure with the first semiconductor devices 13 electrically coupled to the first routing circuitry 16 from the first surface 101 of the first routing circuitry 16. The first semiconductor devices 13 have an active surface 131 facing the first routing circuitry 16, and can be electrically coupled to the first routing circuitry 16 using bumps 185 by thermal compression, solder reflow or thermosonic bonding.

Figure 35:
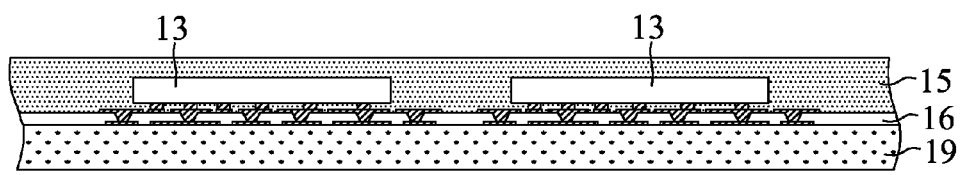
FIG. 35 is a cross-sectional view showing that the structure of FIG. 34 is provided with a balance layer in accordance with the second embodiment of the present invention.

FIG. 35 is a cross-sectional view of the structure with a balance layer 15 on the first semiconductor devices 13 and the first routing circuitry 16. The balance layer 15 covers the first semiconductor devices 13 and the first routing circuitry 16 from above and surrounds and conformally coats and covers sidewalls of the first semiconductor devices 13.

Figure 36:
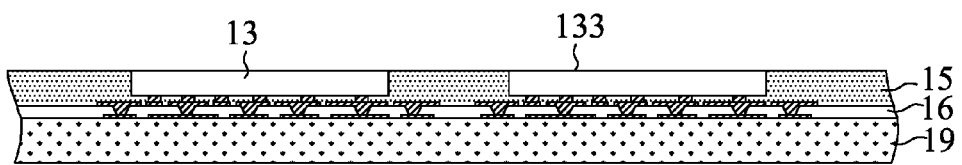
FIG. 36 is a cross-sectional view showing that a top portion of the balance layer is removed from the structure of FIG. 35 in accordance with the second embodiment of the present invention.

FIG. 36 is a cross-sectional view of the structure after removal of the upper portion of the balance layer 15. The inactive surface 133 of the first semiconductor devices 13 is exposed from above and substantially coplanar with the top surface of the balance layer 15.

Figure 37:
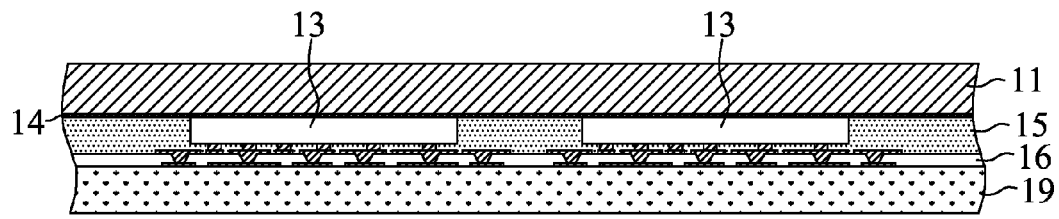
FIG. 37 is a cross-sectional view showing that the structure of FIG. 36 is provided with a stiffener in accordance with the second embodiment of the present invention.

FIG. 37 is a cross-sectional view of the structure with a stiffener 11 attached to the first semiconductor devices 13. The stiffener 11 is attached on the inactive surface 133 of the first semiconductor devices 13 and the top surface of the balance layer 15 using an adhesive 14.

Figure 38:
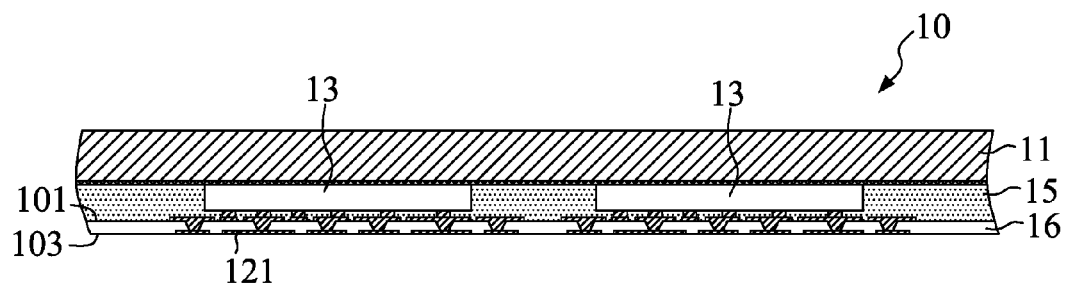
FIGS. 38 and 39 are cross-sectional and bottom perspective views, respectively, showing that the sacrificial carrier is removed from the structure of FIG. 37 in accordance with the second embodiment of the present invention.
Figure 39:
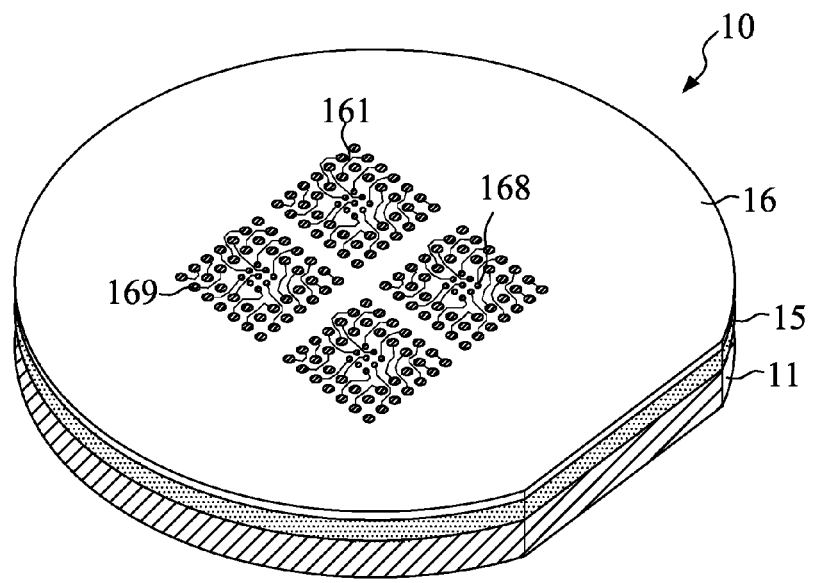

FIGS. 38 and 39 are cross-sectional and bottom perspective views, respectively, of the structure after removal of the sacrificial carrier 19 to expose the second surface 103 of the first routing circuitry 16. The sacrificial carrier 19 can be removed by numerous techniques including wet chemical etching using acidic solution (e.g., ferric chloride, copper sulfate solutions), or alkaline solution (e.g., ammonia solution), electro-chemical etching, or mechanical process such as a drill or end mill followed by chemical etching. In this embodiment, the sacrificial carrier 19 made of an iron-based material is removed by a chemical etching solution that is selective between copper and iron so as to prevent the primary conductive traces 161 made of copper from being etched during removal of the sacrificial carrier 19. As shown in FIG. 39, the primary conductive traces 161 include first contact pads 168 and second contact pads 169. The second contact pads 169 have larger pad size and pitch than those of the first contact pads 168. As a result, the first contact pads 168 can provide electrical contacts for another semiconductor device, whereas the second contact pads 169 can provide electrical contacts for a next level interconnect structure.

At this stage, a subassembly 10 is accomplished and includes a stiffener 11, first semiconductor devices 13, a balance layer 15 and a first routing circuitry 16.

Figure 40:
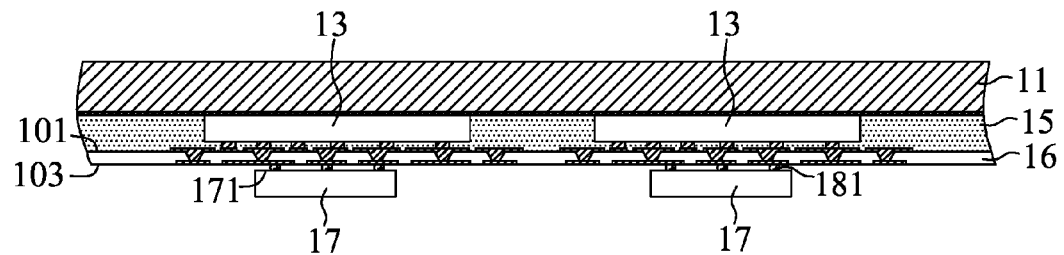
FIGS. 40 and 41 are cross-sectional and bottom perspective views, respectively, showing that second semiconductor devices are electrically coupled to the structure of FIGS. 38 and 39 in accordance with the second embodiment of the present invention.
Figure 41:
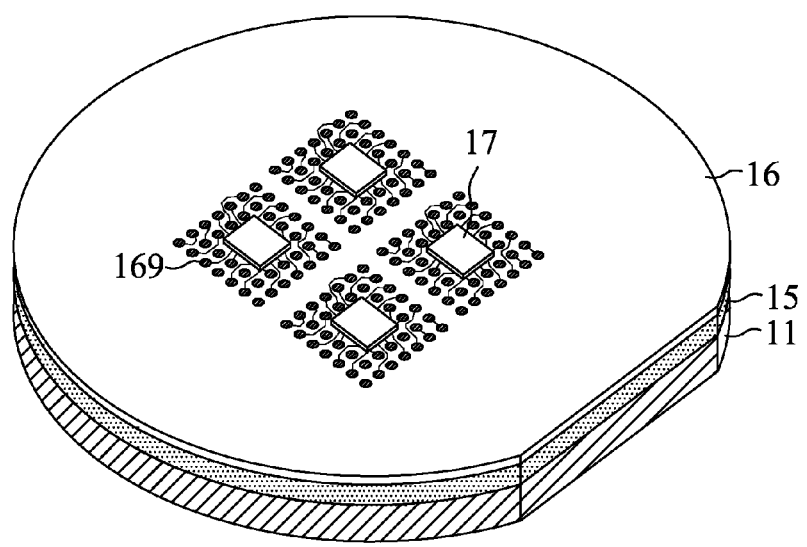

FIGS. 40 and 41 are cross-sectional and bottom perspective views, respectively, of structure provided with second semiconductor devices 17 electrically coupled to the first routing circuitry 16 from the second surface 103 of the first routing circuitry 16. The second semiconductor devices 17 have an active surface 171 facing the first routing circuitry 16, and are electrically coupled to the first contact pads 168 of the primary conductive traces 161 using first bumps 181.

Figure 42:
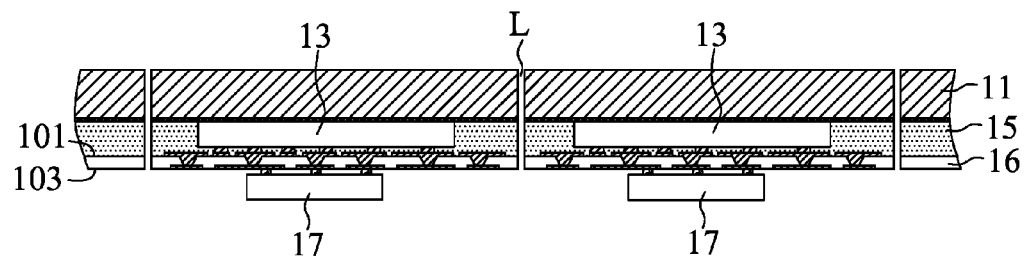
FIG. 42 is a cross-sectional view of a diced state of the panel-scale structure of FIG. 40 in accordance with the second embodiment of the present invention.

FIG. 42 is a cross-sectional view of the panel-scale structure of FIG. 40 diced into individual pieces. The panel-scale structure is singulated into individual pieces, each having a second semiconductor device 17 electrically coupled to a diced unit of subassembly 10, along dicing lines "L".

Figure 43:
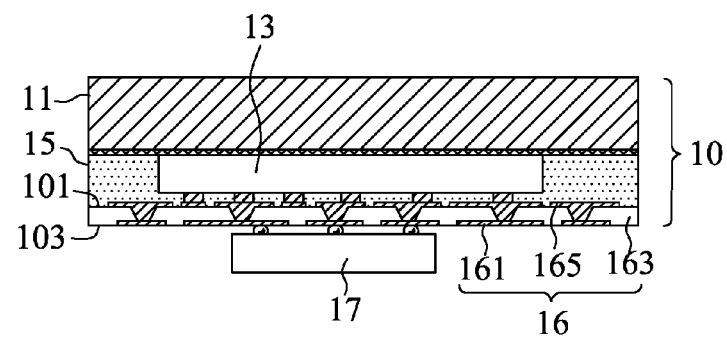
FIG. 43 is a cross-sectional view of the structure corresponding to a diced unit in FIG. 42 in accordance with the second embodiment of the present invention.

FIG. 43 is a cross-sectional view of an individual piece having a second semiconductor device 17 and a subassembly 10 that includes a stiffener 11, a first semiconductor device 13, a balance layer 15 and a first routing circuitry 16. The first semiconductor device 13 and the second semiconductor device 17 are face-to-face mounted on the opposite first surface 101 and second surface 103 of the first routing circuitry 16. The first routing circuitry 16 offers the shortest interconnection distance between the first semiconductor device 13 and the second semiconductor device 17, and provides first level fan-out routing for the first semiconductor device 13 and the second semiconductor device 17.

Figure 44:
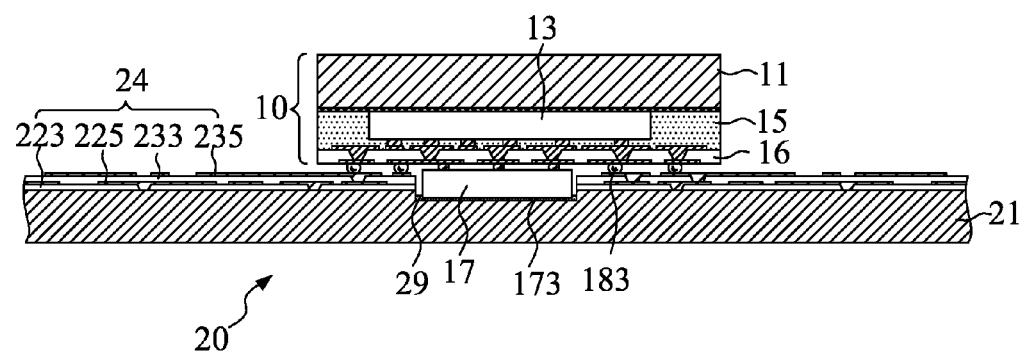
FIG. 44 is a cross-sectional view showing that the structure of FIG. 43 is mounted on the interconnect board of FIG. 27 to finish the fabrication of a face-to-face semiconductor assembly in accordance with the second embodiment of the present invention.

FIG. 44 is a cross-sectional view of the structure with the structure of FIG. 43 mounted on the interconnect board 20 of FIG. 27. The second semiconductor device 17 is inserted into the cavity 205 of the interconnect board 20, with its inactive surface 173 attached to the heat spreader 21 of the interconnect board 20 using a thermally conductive material 29 (typically thermally conductive adhesive). The second routing circuitry 24 of the interconnect board 20 is electrically coupled to the first routing circuitry 16 of the subassembly 10 through the second bumps 183 in contact with the second contact pads 169 and the first terminal pads 238.

Accordingly, as shown in FIG. 44, a face-to-face semiconductor assembly 200 is accomplished and includes a stiffener 11, a first semiconductor device 13, a balance layer 15, a first routing circuitry 16, a second semiconductor device 17 and an interconnect board 20.

The first semiconductor device 13 and the second semiconductor device 17 are face-to-face mounted on the opposite first and second surfaces 101, 103 of the first routing circuitry 16 by flip chip process. The first routing circuitry 16 not only offers the shortest interconnection distance between the first semiconductor device 13 and the second semiconductor device 17, but also provides primary fan-out routing for the first semiconductor device 13 and the second semiconductor device 17. The balance layer 15 covers sidewalls of the first semiconductor device 13 and the first surface 101 of the first routing circuitry 16. The stiffener 11 is attached to the first semiconductor device 13 and the balance layer 15, and provides mechanical support and suppresses warping and bending of the subassembly 10. In the aspect of the stiffener 11 being made of a material with high thermal conductivity, the stiffener 11 can further provide thermal dissipation for the first semiconductor device 13. The interconnect board 20 has a cavity 205 to accommodate the second semiconductor device 17, and includes a heat spreader 21 thermally conductible to the second semiconductor device 17 and a second routing circuitry 24 electrically coupled to the first routing circuitry 16 from the second surface 103 of the first routing circuitry 16. The second routing circuitry 24 provides further fan-out routing/ interconnection to enlarge the pad size and pad pitch of the first routing circuitry 16 so as to match a next level assembly.

Embodiment 3

FIGS. 45-52 are schematic views showing a method of making yet another face-to-face semiconductor assembly that includes yet another aspect of subassembly in accordance with the third embodiment of the present invention.

For purposes of brevity, any description in Embodiments above is incorporated herein insofar as the same is applicable, and the same description need not be repeated.

Figure 45:
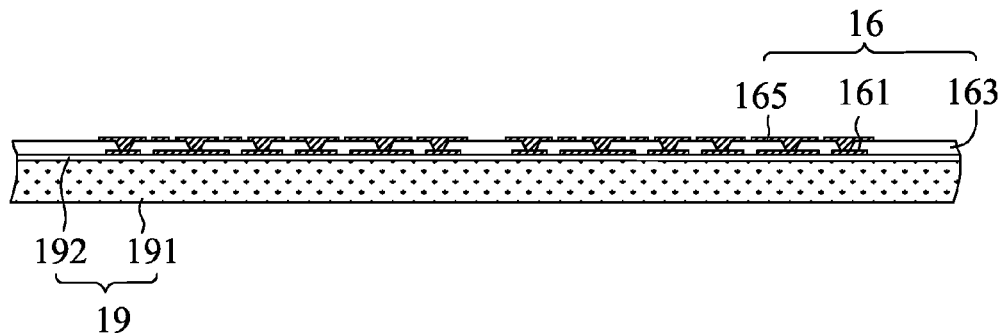
FIG. 45 is a cross-sectional view of a first routing circuitry on a sacrificial carrier in accordance with the third embodiment of the present invention.

FIG. 45 is a cross-sectional view of the structure with a first routing circuitry 16 detachably adhered over a sacrificial carrier 19. In this illustration, the sacrificial carrier 19 is a double-layer structure and includes a support sheet 191 and a barrier layer 192 deposited on the support sheet 191. The first routing circuitry 16 is the same as that illustrated in FIG. 33 and formed on the barrier layer 192. The barrier layer 192 can have a thickness of 0.001 to 0.1 mm and may be a metal layer that is inactive against chemical etching during chemical removal of the support sheet 191 and can be removed without affecting the primary conductive traces 161. For instance, the barrier layer 192 may be made of tin or nickel when the support sheet 191 and the primary conductive traces 161 are made of copper. Further, in addition to metal materials, the barrier layer 192 can also be a dielectric layer such as a peelable laminate film. In this embodiment, the support sheet 191 is a copper sheet, and the barrier layer 192 is a nickel layer of 5 microns in thickness.

Figure 46:
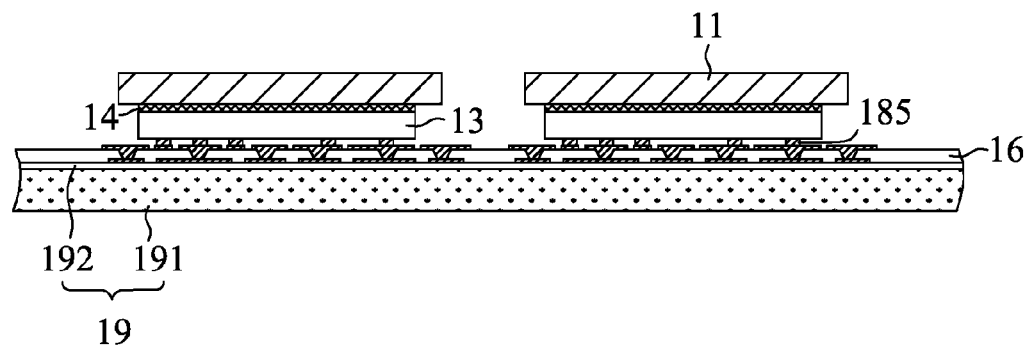
FIG. 46 is a cross-sectional view showing that the structure of FIG. 45 is provided with first semiconductor devices and stiffeners in accordance with the third embodiment of the present invention.

FIG. 46 is a cross-sectional view of the structure with first semiconductor devices 13 electrically coupled to the first routing circuitry 16 from above and stiffeners 11 attached to the first semiconductor devices 13. The first semiconductor devices 13 are electrically coupled to the first routing circuitry 16 using bumps 185. The stiffeners 11 are attached on the first semiconductor devices 13 using an adhesive 14.

Figure 47:
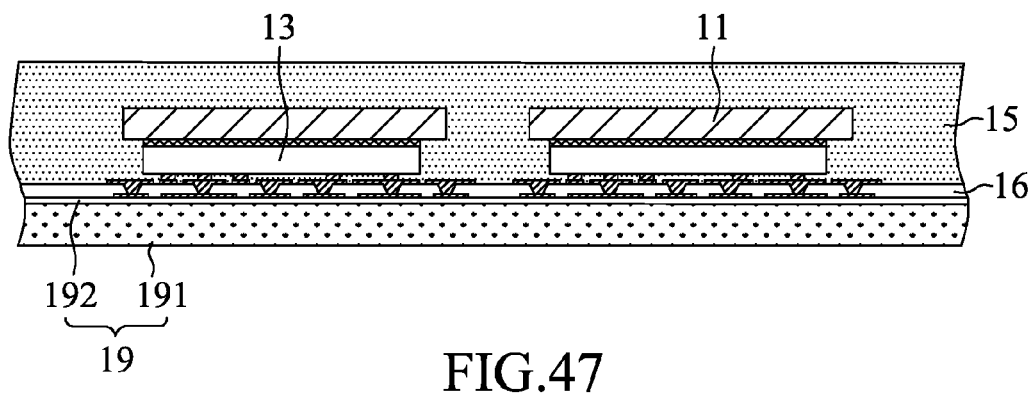
FIG. 47 is a cross-sectional view showing that the structure of FIG. 46 is provided with a balance layer in accordance with the third embodiment of the present invention.

FIG. 47 is a cross-sectional view of the structure with a balance layer 15 on the stiffeners 11 and the first routing circuitry 16. The balance layer 15 covers the stiffeners 11 and the first routing circuitry 16 from above and surrounds and conformally coats and covers sidewalls of the first semiconductor devices 13 and the stiffeners 11.

Figure 48:
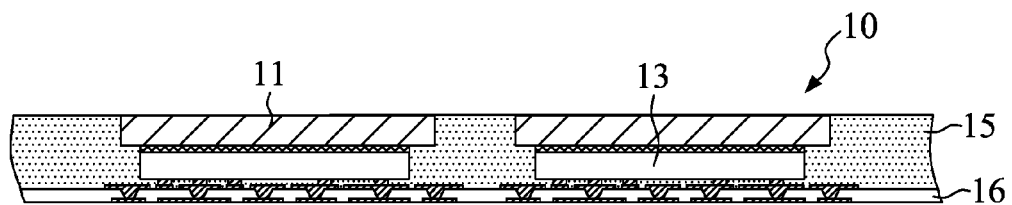
FIG. 48 is a cross-sectional view showing that a top portion of the balance layer and the sacrificial carrier are removed from the structure of FIG. 47 in accordance with the third embodiment of the present invention.

FIG. 48 is a cross-sectional view of the structure after removal of the sacrificial carrier 19 and the upper portion of the balance layer 15. The stiffeners 11 are exposed from above and substantially coplanar with the balance layer 15 at the top surfaces thereof. The first routing circuitry 16 is exposed from below by removing the support sheet 191 made of copper using an alkaline etching solution and then removing the barrier layer 192 made of nickel using an acidic etching solution. In another aspect of the barrier layer 192 being a peelable laminate film, the barrier layer 192 can be removed by mechanical peeling or plasma ashing.

At this stage, a subassembly 10 is accomplished and includes a stiffener 11, first semiconductor devices 13, a balance layer 15 and a first routing circuitry 16.

Figure 49:
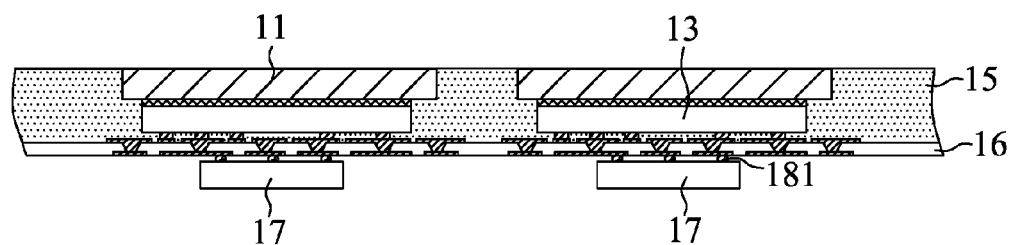
FIG. 49 is a cross-sectional view showing that second semiconductor devices are electrically coupled to the structure of FIG. 48 in accordance with the third embodiment of the present invention.

FIG. 49 is a cross-sectional view of the structure provided with second semiconductor devices 17 electrically coupled to the first routing circuitry 16 from below. The second semiconductor devices 17 are electrically coupled to the first contact pads 168 of the primary conductive traces 161 using first bumps 181.

Figure 50:
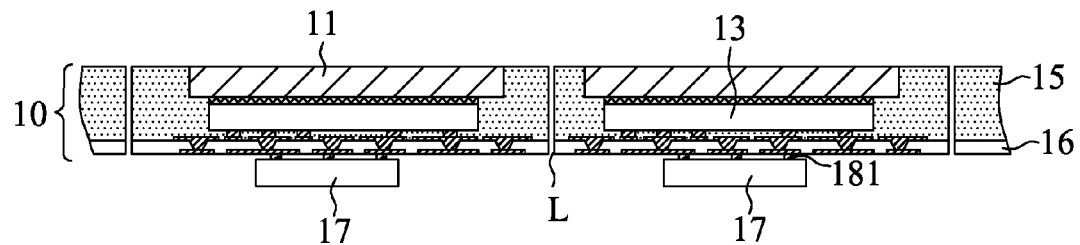
FIG. 50 is a cross-sectional view of a diced state of the panel-scale structure of FIG. 49 in accordance with the third embodiment of the present invention.

FIG. 50 is a cross-sectional view of the panel-scale structure of FIG. 49 diced into individual pieces. The panel-scale structure is singulated into individual pieces, each having a second semiconductor device 17 electrically coupled to a diced unit of subassembly 10, along dicing lines "L".

Figure 51:
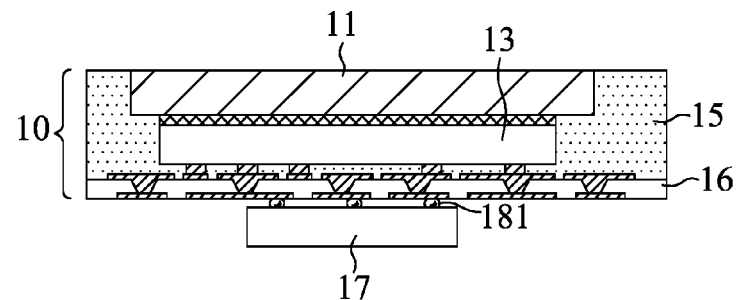
FIG. 51 is a cross-sectional view of the structure corresponding to a diced unit in FIG. 50 in accordance with the third embodiment of the present invention.

FIG. 51 is a cross-sectional view of an individual piece having a second semiconductor device 17 and a subassembly 10 that includes a stiffener 11, a first semiconductor device 13, a balance layer 15 and a first routing circuitry 16. The first semiconductor device 13 and the second semiconductor device 17 are face-to-face mounted on the opposite first surface 101 and second surface 103 of the first routing circuitry 16. The first routing circuitry 16 offers the shortest interconnection distance between the first semiconductor device 13 and the second semiconductor device 17, and provides first level fan-out routing for the first semiconductor device 13 and the second semiconductor device 17.

Figure 52:
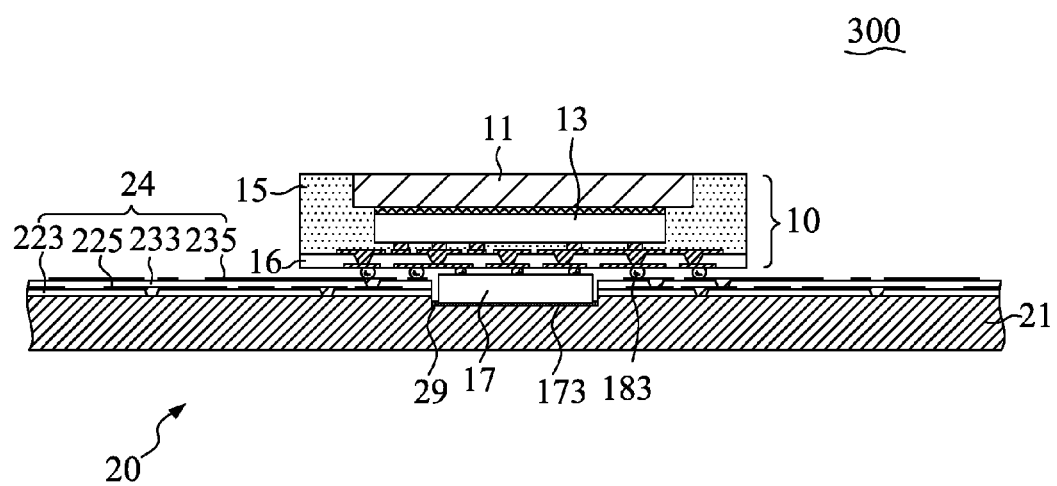
FIG. 52 is a cross-sectional view showing that the structure of FIG. 51 is mounted on the interconnect board of FIG. 27 to finish the fabrication of a face-to-face semiconductor assembly in accordance with the third embodiment of the present invention.

FIG. 52 is a cross-sectional view of the structure with the structure of FIG. 51 mounted on the interconnect board 20 of FIG. 27. The second semiconductor device 17 is inserted into the cavity 205 of the interconnect board 20, with its inactive surface 173 attached to the heat spreader 21 of the interconnect board 20 using a thermally conductive material 29 (typically thermally conductive adhesive). The second routing circuitry 24 of the interconnect board 20 is electrically coupled to the first routing circuitry 16 of the subassembly 10 through the second bumps 183 in contact with the primary conductive traces 161 and the third conductive traces 235.

Accordingly, as shown in FIG. 52 a face-to-face semiconductor assembly 300 is accomplished and includes a subassembly 10, a second semiconductor device 17 and an interconnect board 20. The second semiconductor device 17 and the interconnect board 20 are electrically coupled to the subassembly 10, and the interconnect board 20 laterally extends beyond peripheral edges of the subassembly 10.

The subassembly 10 includes a stiffener 11, a first semiconductor device 13, a balance layer 15 and a first routing circuitry 16. The first semiconductor device 13 and the second semiconductor device 17 are face-to-face mounted on the opposite first and second surfaces 101, 103 of the first routing circuitry 16 by flip chip process. The stiffener 11 is attached on the first semiconductor device 13. The balance layer 15 laterally surrounds the stiffener 11 and the first semiconductor device 13 and covers the first surface 101 of the first routing circuitry 16. The interconnect board 20 has a cavity 205 and includes a heat spreader 21 and a second routing circuitry 24. The second semiconductor device 17 is located in the cavity 205 and is thermally conductible to the heat spreader 21. The second routing circuitry 24 is electrically connected to the first semiconductor device 13 and the second semiconductor device 17 through the first routing circuitry 16.

Embodiment 4

FIGS. 53-57 are schematic views showing a method of making yet another face-to-face semiconductor assembly that includes yet another aspect of subassembly in accordance with the fourth embodiment of the present invention.

For purposes of brevity, any description in Embodiments above is incorporated herein insofar as the same is applicable, and the same description need not be repeated.

Figure 53:
FIG. 53 is a cross-sectional view showing that a second dielectric layer is provided on a heat spreader in accordance with the fourth embodiment of the present invention.

FIG. 53 is a cross-sectional view of the structure with a second dielectric layer 223 laminated/coated on a heat spreader 21. The second dielectric layer 223 contacts and covers a selected portion of the heat spreader 21 from above.

Figure 54:
FIG. 54 is a cross-sectional view showing that the structure of FIG. 53 is provided with second conductive traces in accordance with the fourth embodiment of the present invention.

FIG. 54 is a cross-sectional view of the structure provided with second conductive traces 225 on the second dielectric layer 223 by metal deposition and metal patterning process. The second conductive traces 225 extend laterally on the second dielectric layer 223.

Figure 55:
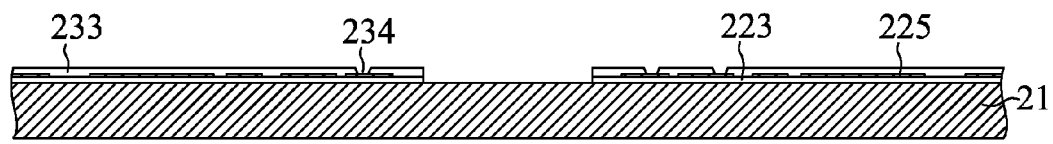
FIG. 55 is a cross-sectional view showing that the structure of FIG. 54 is provided with a third dielectric layer and third via openings in accordance with the fourth embodiment of the present invention.

FIG. 55 is a cross-sectional view of the structure with a third dielectric layer 233 laminated/coated on the second dielectric layer 223/second conductive traces 225 and third via openings 234 in the third dielectric layer 233. The third dielectric layer 233 contacts and covers the second dielectric layer 223/second conductive traces 225 from above. The third via openings 234 extend through the third dielectric layer 233 to expose selected portions of the second conductive traces 225 from above.

Figure 56:
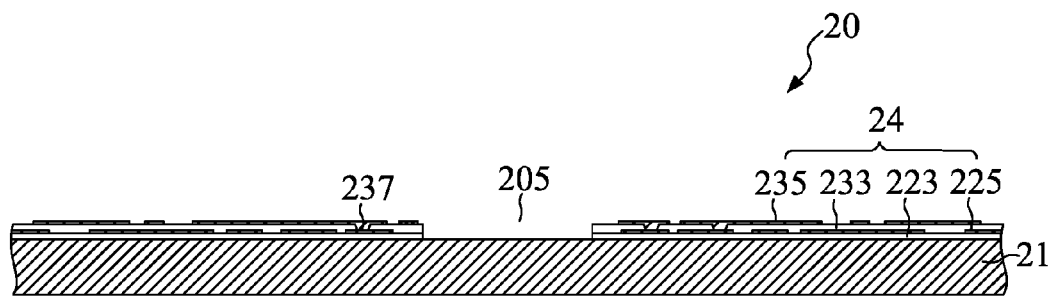
FIG. 56 is a cross-sectional view showing that the structure of FIG. 55 is provided with third conductive traces to finish the fabrication of an interconnect board in accordance with the fourth embodiment of the present invention.

FIG. 56 is a cross-sectional view of the structure provided with third conductive traces 235 on the third dielectric layer 233 by metal deposition and metal patterning process. The third conductive traces 235 extend from the second conductive traces 225 in the upward direction, fill up the third via openings 234 to form third conductive vias 237 in direct contact with the second conductive traces 225, and extend laterally on the third dielectric layer 233.

At this stage, an interconnect board 20 having a cavity 205 is accomplished and includes a heat spreader 21 and a second routing circuitry 24. The cavity 205 extends through the second routing circuitry 24 and can accommodate the second semiconductor device 17 electrically coupled to the subassembly 10. In this illustration, the second routing circuitry 24 includes a second dielectric layer 223, second conductive traces 225, a third dielectric layer 233 and third conductive traces 235.

Figure 57:
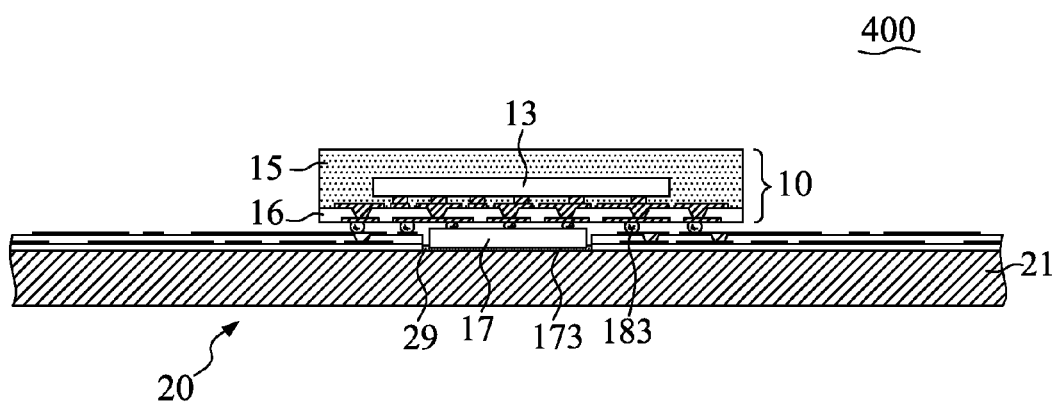
FIG. 57 is a cross-sectional view showing that a face-to-face component is mounted on the interconnect board of FIG. 56 to finish the fabrication of a face-to-face semiconductor assembly in accordance with the fourth embodiment of the present invention.

FIG. 57 is a cross-sectional view of the structure with a face-to-face component mounted on the interconnect board 20 of FIG. 56. The face-to-face component can be fabricated from the panel-scale structure of FIG. 35 by removing the sacrificial carrier 19 therefrom and dicing the panel-scale structure into individual pieces. The second semiconductor device 17 is inserted into the cavity 205 of the interconnect board 20, with its inactive surface 173 attached to the heat spreader 21 of the interconnect board 20 using a thermally conductive material 29 (typically thermally conductive adhesive). The second routing circuitry 24 of the interconnect board 20 is electrically coupled to the first routing circuitry 16 of the subassembly 10 through the second bumps 183 in contact with the primary conductive traces 161 and the third conductive traces 235.

Accordingly, as shown in FIG. 57, a face-to-face semiconductor assembly 400 is accomplished and includes a first semiconductor device 13, a balance layer 15, a first routing circuitry 16, a second semiconductor device 17, a heat spreader 21 and a second routing circuitry 24.

The first routing circuitry 16 provides primary fan-out routing and the shortest interconnection distance between the first semiconductor device 13 and the second semiconductor device 17. The balance layer 15 encloses the first semiconductor device 13 and provides a high modulus anti-warping platform for the first semiconductor device 13 and the first routing circuitry 16. The heat spreader 21 provides thermal dissipation for the second semiconductor device 17 and another high modulus anti-warping platform for the subassembly 10 and the second routing circuitry 24. The second routing circuitry 24 laterally extends beyond peripheral edges of the first routing circuitry 16 and is electrically coupled to the first routing circuitry 16 to provide further fan-out routing.

The semiconductor assemblies described above are merely exemplary. Numerous other embodiments are contemplated. In addition, the embodiments described above can be mixed-and-matched with one another and with other embodiments depending on design and reliability considerations. The subassembly mounted on the interconnect board can include multiple first semiconductor devices and be electrically coupled to multiple second semiconductor devices, and the second semiconductor device can share or not share the cavity with other second semiconductor devices. For instance, a cavity can accommodate a single second semiconductor device, and the interconnect board can include multiple cavities arranged in an array for multiple second semiconductor devices. Alternatively, numerous second semiconductor devices can be positioned within a single cavity. Likewise, a subassembly can share or not share the interconnect board with other subassemblies. For instance, a single subassembly can be electrically connected to the interconnect board. Alternatively, numerous subassemblies may be coupled to the interconnect board. For instance, four subassemblies in a 2×2 array can be coupled to the interconnect board and the second routing circuitry of the interconnect board can include additional terminal pads to receive and route additional subassembly pads.

As illustrated in the aforementioned embodiments, a distinctive face-to-face semiconductor assembly is configured and includes a first semiconductor device, a balance layer, a first routing circuitry, a second semiconductor device, an optional stiffener, and an interconnect board having a second routing circuitry over a heat spreader. For the convenience of following description, the direction in which the first surface of the first routing circuitry faces is defined as the first direction, and the direction in which the second surface of the first routing circuitry faces is defined as the second direction.

The first and second semiconductor devices are face-to-face electrically connected to each other through the first routing circuitry therebetween. The first and second semiconductor devices can be packaged or unpackaged chips. For instance, the first and second semiconductor devices can be bare chips, or wafer level packaged dies, etc. In a preferred embodiment, a subassembly having the first semiconductor device electrically coupled to the first routing circuitry is prepared by the steps of: electrically coupling the first semiconductor device to the first routing circuitry detachably adhered over a sacrificial carrier from the first surface of the first routing circuitry; providing the balance layer over the first routing circuitry; and removing the sacrificial carrier to expose the second surface of the first routing circuitry. By a well-known flip chip bonding process such as thermo-compression or solder reflow, the first semiconductor device can be electrically coupled to the first routing circuitry using bumps. Likewise, the second semiconductor device can be electrically coupled to the subassembly using bumps at the second surface of the first routing circuitry by a well-known flip chip bonding process. The sacrificial carrier can be detached from the first routing circuitry by a chemical etching process or a mechanical peeling process after the formation of the balance layer. Preferably, the subassembly is fabricated by a panel scale process followed by a singulation process. Further, before or after the step of providing the balance layer, a stiffener may be attached to the first semiconductor device using an adhesive. In a thermally enhanced case, it is preferred to attach a thermally conductive stiffener to the first semiconductor device using a thermally conductive adhesive. As a result, the stiffener not only provides mechanical support for the subassembly, but also provides thermal dissipation for the first semiconductor device. Additionally, the subassembly may be fabricated by another process that includes steps of: attaching the first semiconductor device to a stiffener using an adhesive (typically a thermally conductive adhesive when a thermally conductive stiffener is used); providing the balance layer over the stiffener; and forming the first routing circuitry over the first semiconductor device and the balance layer, with the first semiconductor device being electrically coupled to the first routing circuitry from the first surface of the first routing circuitry. In this process, the first routing circuitry can be electrically coupled to the first semiconductor device by direct build-up process. Further, an alignment guide may be provided to ensure the placement accuracy of the first semiconductor device on the stiffener. Specifically, the alignment guide projects from a surface of the stiffener, and the first semiconductor device is attached to the stiffener with the alignment guide laterally aligned with the peripheral edges of the first semiconductor device. As the alignment guide extending beyond the inactive surface of the first semiconductor device in the second direction and in close proximity to the peripheral edges of the first semiconductor device, any undesirable movement of the first semiconductor device can be avoided. As a result, a higher manufacturing yield for the first routing circuitry interconnected to the first semiconductor device can be ensured.

The alignment guide can have various patterns against undesirable movement of the first semiconductor device. For instance, the alignment guide can include a continuous or discontinuous strip or an array of posts. Alternatively, the alignment guide may laterally extend to the peripheral edges of the stiffener and have inner peripheral edges that conform to the peripheral edges of the first semiconductor device. Specifically, the alignment guide can be laterally aligned with four lateral surfaces of the first semiconductor device to define an area with the same or similar topography as the first semiconductor device and prevent the lateral displacement of the first semiconductor device. For instance, the alignment guide can be aligned along and conform to four sides, two diagonal corners or four corners of the first semiconductor device so as to confine the dislocation of the first semiconductor device laterally. Besides, the alignment guide around the inactive surface of the first semiconductor device preferably has a height in a range of 5-200 microns.

The interconnect board laterally extends beyond peripheral edges of the subassembly and preferably has a cavity that extends through the second routing circuitry to expose a selected portion of the heat spreader and accommodate the second semiconductor device. The heat spreader can provide thermal dissipation for the second semiconductor device attached to the heat spreader using a thermally conductive material. The second routing circuitry can be electrically coupled to the first routing circuitry by bumps, not by direct build-up process. Preferably, the bumps in contact with the second routing circuitry have a height larger than that of the bumps in contact with the second semiconductor device but smaller than the combined height of the second semiconductor device and the bumps in contact with the second semiconductor device. More specifically, the combined height of the second semiconductor device and the bumps in contact with the second semiconductor device may be substantially equal to the sum of the cavity depth plus the height of the bumps in contact with the second routing circuitry.

The first and second routing circuitries can be buildup circuitries without a core layer. The first routing circuitry laterally extends beyond the peripheral edges of the first and second semiconductor devices, whereas the second routing circuitry laterally extends beyond the peripheral edges of the first routing circuitry. As such, the second routing circuitry has a larger surface area than that of the first routing circuitry. Preferably, the first and second routing circuitries are multi-layered buildup circuitries and each can include at least one dielectric layer and conductive traces that fill up via openings in the dielectric layer and extend laterally on the dielectric layer. The dielectric layer and the conductive traces are serially formed in an alternate fashion and can be in repetition when needed.

The first routing circuitry can provide primary fan-out routing/interconnection and the shortest interconnection distance between the first and second semiconductor devices. Specifically, the first routing circuitry at its second surface preferably includes conductive traces with larger pad size and pad pitch than those of the first and second semiconductor devices. For instance, the first routing circuitry can include top conductive traces at its first surface for the first semiconductor device connection and bottom conductive traces at its second surface for the second semiconductor device connection and the second routing circuitry connection. The top conductive traces can be electrically connected to the bottom conductive traces through conductive vias or inner conductive traces. In a preferred embodiment, the bottom conductive traces at the second surface have first contact pads for chip connection and second contact pads for next level routing circuitry connection. The first contact pads have pad size and pitch that match I/O pads of the second semiconductor device. The second contact pads have pad size and pad pitch that are larger than those of the first contact pads and I/O pads of the first and second semiconductor devices and match first terminal pads of the second routing circuitry. Accordingly, the second semiconductor device can be electrically coupled to the first contact pads, and the second routing circuitry can be interconnected to the second contact pads. As an alternative, the first routing circuitry may include conductive traces that contact and extend from the first semiconductor device, fill up via openings of a dielectric layer to form conductive vias in electrical contact with the first semiconductor device, and laterally extend on the dielectric layer to provide the first contact pads for the second semiconductor device and the second contact pads with larger pad size and pad pitch than those of the first and second semiconductor devices.

The second routing circuitry can provide further fan-out routing/interconnection to enlarge the pad size and pad pitch of the first routing circuitry. More specifically, the second routing circuitry can be formed to include a dielectric layer over the heat spreader, and conductive traces laterally extend on the dielectric layer of the second routing circuitry. The outmost conductive traces of the second routing circuitry can have first terminal pads for the first routing circuitry connection and second terminal pads for the next level assembly or another electronic device connection. The first terminal pads have pad size and pitch that match second contact pads of the first routing circuitry, whereas the second terminal pads have larger pad size and pad pitch than those of the first terminal pads. Accordingly, the first terminal pads of the second routing circuitry can be electrically coupled to the second contact pads of the first routing circuitry, and the second terminal pads can accommodate conductive joints, such as solder balls, for electrical communication and mechanical attachment with the next level assembly or another electronic device. Further, the second routing circuitry may also be electrically coupled to the heat spreader through conductive vias in direct contact with the heat spreader for ground connection.

The term "cover" refers to incomplete or complete coverage in a vertical and/or lateral direction. For instance, in the cavity-up position, the heat spreader covers the second semiconductor device in the downward direction regardless of whether another element such as the thermally conductive material is between the second semiconductor device and the heat spreader.

The phrase "attached on" includes contact and non-contact with a single or multiple element(s). For instance, the heat spreader is attached on the inactive surface of the second semiconductor device regardless of whether it is separated from the second semiconductor device by a thermally conductive material.

The phrase "aligned with" refers to relative position between elements regardless of whether elements are spaced from or adjacent to one another or one element is inserted into and extends into the other element. For instance, the alignment guide is laterally aligned with the first semiconductor device since an imaginary horizontal line intersects the alignment guide and the first semiconductor device, regardless of whether another element is between the alignment guide and the first semiconductor device and is intersected by the line, and regardless of whether another imaginary horizontal line intersects the first semiconductor device but not the alignment guide or intersects the alignment guide but not the first semiconductor device. Likewise, the second semiconductor device is aligned with the cavity of the interconnect board.

The phrase "in close proximity to" refers to a gap between elements not being wider than the maximum acceptable limit. As known in the art, when the gap between the first semiconductor device and the alignment guide is not narrow enough, the location error of the first semiconductor device due to the lateral displacement of the first semiconductor device within the gap may exceed the maximum acceptable error limit. In some cases, once the location error of the first semiconductor device goes beyond the maximum limit, it is impossible to align the predetermined portion of the first semiconductor device with a laser beam, resulting in the electrical connection failure between the first semiconductor device and the routing circuitry. According to the pad size of the first semiconductor device, those skilled in the art can ascertain the maximum acceptable limit for a gap between the first semiconductor device and the alignment guide through trial and error to ensure the conductive vias of the routing circuitry being aligned with the I/O pads of the first semiconductor device. Thereby, the description "the alignment guide is in close proximity to the peripheral edges of the first semiconductor device" means that the gap between the peripheral edges of the first semiconductor device and the alignment guide is narrow enough to prevent the location error of the first semiconductor device from exceeding the maximum acceptable error limit. For instance, the gaps in between the first semiconductor device and the alignment guide may be in a range of about 5 to 50 microns.

The phrases "electrical connection", "electrically connected" and "electrically coupled" refer to direct and indirect electrical connection. For instance, the outmost conductive traces, away from the heat spreader, of the second routing circuitry directly contact and are electrically connected to the first bumps, and the innermost conductive traces, adjacent to the heat spreader, of the second routing circuitry are spaced from and electrically connected to the first bumps by the inner conductive traces.

The "first direction" and "second direction" do not depend on the orientation of the semiconductor assembly, as will be readily apparent to those skilled in the art. For instance, the first surface of the first routing circuitry faces the first direction and the second surface of the first routing circuitry faces the second direction regardless of whether the semiconductor assembly is inverted. Thus, the first and second directions are opposite one another and orthogonal to the lateral directions. Furthermore, the first direction is the upward direction and the second direction is the downward direction in the cavity-up position, and the first direction is the downward direction and the second direction is the upward direction in the cavity-down position.

The semiconductor assembly according to the present invention has numerous advantages. For instance, the first and second semiconductor devices are face-to-face mounted on opposite sides of the first routing circuitry, which can offer the shortest interconnect distance between the first and second semiconductor devices. The first routing circuitry provides a first level fan-out routing/interconnection for the first and second semiconductor devices whereas the second routing circuitry provides a second level fan-out routing/interconnection. As the first routing circuitry of the subassembly can be attached to the second routing circuitry of the interconnect board by bumps, not by direct build-up process, the simplified process steps result in lower manufacturing cost. The heat spreader can provide thermal dissipation, electromagnetic shielding and moisture barrier for the second semiconductor device, and also provides mechanical support for the subassembly and the second routing circuitry. The semiconductor assembly made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A face-to-face semiconductor assembly with a built-in heat spreader, comprising:
    a subassembly that includes a first semiconductor device, a balance layer and a first routing circuitry having a first surface and an opposite second surface, wherein the first semiconductor device is electrically coupled to the first routing circuitry from the first surface of the first routing circuitry and the balance layer laterally surrounds the first semiconductor device and covers the first surface of the first routing circuitry;
    a second semiconductor device; and
    an interconnect board that includes a heat spreader and a second routing circuitry disposed over the heat spreader, wherein the heat spreader is made entirely of a metal or an alloy and laterally extends to peripheral edges of the second routing circuitry to support the entire second routing circuitry,
    wherein
    (i) the second semiconductor device is attached to the heat spreader and laterally surrounded by the second routing circuitry and electrically coupled to the first routing circuitry by an array of first bumps,
    (ii) the second routing circuitry is electrically coupled to the first routing circuitry by an array of second bumps, and (iii) both the first bumps and the second bumps are disposed at the second surface of the first routing circuitry, and wherein the second routing circuitry of the interconnect board includes first terminal pads and second terminal pads at its exterior surface facing the first routing circuitry, wherein the first terminal pads are in contact with the second bumps to be electrically coupled to the first routing circuitry, and the second terminal pads have larger pad size and pad pitch than those of the first terminal pads.

2. The semiconductor assembly of claim 1, wherein the second semiconductor device is disposed in a cavity of the interconnect board laterally surrounded by the second routing circuitry, wherein the cavity extends into a recess in the heat spreader.

3. The semiconductor assembly of claim 1, wherein the subassembly further includes a stiffener that is attached to an inactive surface of the first semiconductor device.

4. The semiconductor assembly of claim 1, wherein the first routing circuitry includes at least one conductive trace laterally extending beyond peripheral edges of the first semiconductor device, whereas the second routing circuitry includes at least one conductive trace laterally extending beyond peripheral edges of the subassembly.

* * * * *